US008589125B2

(12) United States Patent
Mori et al.

(10) Patent No.: US 8,589,125 B2
(45) Date of Patent: Nov. 19, 2013

(54) PRODUCT DESIGN SUPPORT SYSTEM AND METHOD FOR SIMULATING A PROTOTYPE OF A DESIGN OBJECT

(75) Inventors: Hatsuo Mori, Tokyo (JP); Hirotaka Kure, Tokyo (JP)

(73) Assignee: IHI Corporation, Tokyo (JP)

( * ) Notice: Subject to any disclaimer, the term of this patent is extended or adjusted under 35 U.S.C. 154(b) by 644 days.

(21) Appl. No.: 12/681,381

(22) PCT Filed: Oct. 3, 2008

(86) PCT No.: PCT/JP2008/068047
§ 371 (c)(1),
(2), (4) Date: Apr. 2, 2010

(87) PCT Pub. No.: WO2009/044850
PCT Pub. Date: Apr. 9, 2009

(65) Prior Publication Data
US 2010/0250200 A1    Sep. 30, 2010

(30) Foreign Application Priority Data

Oct. 4, 2007   (JP) ................................ 2007-260974

(51) Int. Cl.
*G06F 9/455*    (2006.01)

(52) U.S. Cl.
USPC ........... 703/2; 703/1; 703/13; 703/14; 703/22

(58) Field of Classification Search
USPC ............................................ 703/1, 2, 13, 14
See application file for complete search history.

(56) References Cited

U.S. PATENT DOCUMENTS 5,343,537 A * 8/1994 Bellegarda et al. ............ 382/186
5,974,246 A * 10/1999 Nakazawa ......................... 703/2

(Continued)

FOREIGN PATENT DOCUMENTS

JP    2 150972    6/1990
JP    8 166876    6/1996

(Continued)

OTHER PUBLICATIONS

Extended European Search Report issued Sep. 30, 2011, in Patent Application No. 08835255.4.

(Continued)

*Primary Examiner* — Omar Fernandez Rivas
*Assistant Examiner* — Kibrom Gebresilassie
(74) *Attorney, Agent, or Firm* — Oblon, Spivak, McClelland, Maier & Neustadt, L.L.P.

(57) ABSTRACT

The invention relates to a product design support system for supporting product design business so as to design and develop a product in a short time. The system creates an L-row orthogonal table according to set design parameters, executes many times, for each of L sets of design parameter groups, a virtual prototyping operation by adjusting the dimensional tolerance of each part, processes averages and variances of L sets of evaluation indexes obtained by the virtual prototyping operations, to form a response surface and response surface model, makes a factorial effect diagram of design parameters for each evaluation index, examines the factorial effect diagram, forms optional combinations of design parameters sensitive to the evaluation indexes, applies the combinations to the response surface model, forms many design solutions by optionally combining all design parameters that may achieve design target values, conducts filtering to extract a maximum likelihood design solution candidate group that achieves specified evaluation index limit values out of the design solutions, selects a maximum likelihood design solution group from the solution candidate group, and presents the same to a user.

13 Claims, 24 Drawing Sheets

(56) References Cited

U.S. PATENT DOCUMENTS

| | | | |
|---|---|---|---|
| 6,148,494 A * | 11/2000 | Bauer et al. | 29/407.05 |
| 6,353,815 B1 * | 3/2002 | Vilim et al. | 706/15 |
| 6,430,993 B1 * | 8/2002 | Seta | 73/146 |
| 6,546,522 B1 * | 4/2003 | Chen | 716/115 |
| 6,920,413 B2 * | 7/2005 | Sumida et al. | 702/189 |
| 6,928,402 B2 * | 8/2005 | Ho et al. | 703/22 |
| 7,289,859 B2 * | 10/2007 | Miwa et al. | 700/97 |
| 7,349,838 B2 * | 3/2008 | Summers | 703/22 |
| 7,580,815 B2 * | 8/2009 | Kawakami et al. | 703/2 |
| 2003/0191612 A1 * | 10/2003 | Chang | 703/2 |
| 2006/0068513 A1 * | 3/2006 | Funakubo et al. | 438/14 |
| 2006/0073455 A1 * | 4/2006 | Buyl et al. | 434/262 |
| 2006/0184482 A1 * | 8/2006 | Flinn et al. | 706/45 |
| 2007/0043622 A1 * | 2/2007 | Olsen et al. | 705/22 |
| 2007/0044049 A1 * | 2/2007 | Adams et al. | 716/4 |
| 2007/0078553 A1 * | 4/2007 | Miwa et al. | 700/97 |
| 2007/0107971 A1 * | 5/2007 | Nagao et al. | 180/300 |
| 2008/0004855 A1 * | 1/2008 | Sakai | 703/14 |

FOREIGN PATENT DOCUMENTS

| | | |
|---|---|---|
| JP | 10 149384 | 6/1998 |
| JP | 2000 331035 | 11/2000 |
| JP | 2001 125933 | 5/2001 |
| JP | 2003 281194 | 10/2003 |
| JP | 2006 11729 | 1/2006 |
| JP | 2006 31488 | 2/2006 |
| JP | 2007-19181 | 1/2007 |
| RU | 2 119 188 C1 | 9/1998 |
| RU | 2 321 886 C2 | 4/2008 |
| WO | 2006 100712 | 9/2006 |

OTHER PUBLICATIONS

Wei Shyy, et al., "Global design optimization for aerodynamics and rocket propulsion components", Progress in Aerospace Sciences, vol. 37, No. 1, XP 027357134, Jan. 1, 2001, pp. 59-118.

Martin Sippel, et al., "First-Stage Design Variations of Partially Reusable Launch Vehicles", Journal of Spacecraft and Rockets, vol. 39, No. 4, XP 001124849, Jul.-Aug. 2002, pp. 571-579.

Decision to Grant issued Apr. 28, 2011 in Russia Application No. 2010117348 (With English Translation).

* cited by examiner

| ID | Risk_ID | ACTIVITY | | | | RISK REDUCTION PLAN | | | ACTUAL ACTION | | |
|---|---|---|---|---|---|---|---|---|---|---|---|
| | | TIME | PHENOMENON | ENVIRONMENT | VERIFICATION | TECHNICAL | INFLUENCE | RISK | TEST WBS NUMBER | COMPLETION |
| Risk_Plan00007 | 0012 | MIDDLE OF CONCEPTUAL DESIGN | 4 | 2 | 1.5 | DOCUMENT MODEL | | | | |
| Risk | | 2007/01/30 | 4 | 2 | 1.5 | 4 | 4 | 16 | NA | ☑ |
| Risk_Plan00008 | 0012 | END OF CONCEPTUAL DESIGN | 2 | 2 | 1 | EXISTING SAMPLE EXAMINATION TEST | | | | |
| Risk | | 2007/03/10 | 2 | 2 | 1 | 2 | 4 | 8 | NA | ☑ |
| Risk_Plan00009 | 0012 | ELEMENT TEST | 1 | 2 | 1 | PRESSURE LOSS CONFIRMATION TEST | | | | |
| Risk | | 2007/07/30 | 1 | 2 | 1 | 1 | 4 | 4 | 22240 | ☐ |
| Risk_Plan00010 | 0012 | PROTOTYPE ENGINE | 1 | 1 | 1 | PROTOTYPE ENGINE COMBUSTION TEST | | | | |
| Risk | | 2008/08/10 | 1 | 1 | 1 | 1 | 4 | 4 | 10260 | ☐ |
| Risk_Plan00011 | 0012 | EM | 1 | 1 | 1 | ENGINE EM COMBUSTION TEST | | | | |
| Risk | | 2009/06/30 | 1 | 1 | 1 | 1 | 4 | 4 | 10270 | ☐ |
| (AUTONUMBER) | | | | | | | | | | |
| Risk | | | | | | | | | | ☐ | tbl_RISK REDUCTION PLAN

RECORD: 1 of 5 (FILTER)

FIG. 7A

PHENOMENON COMPREHENSION LEVEL

| RATING | GRASPING OF MECHANISMS AND DOMINANT PARAMETERS (INCLUDING GRASPING OF ENVIRONMENTAL CONDITIONS) | SCORE |
|---|---|---|
| a | MECHANISMS AND DOMINANT PARAMETERS ARE GRASPED. (MODELING POSSIBLE LEVEL) | 1 |
| b | ALTHOUGH MODELING IS DIFFICULT, QUALITATIVE MECHANISMS ARE GRASPED WITH BASES. | 2 |
| c | NOT GRASPED. HOWEVER, SPECIFICATIONS ARE SET ACCORDING TO SIMILARITY OF PREVIOUS MACHINES AND DOCUMENTS. | 4 |
| d | NOT GRASPED. NO BASES FOR SETTING SPECIFICATIONS. | 8 |

FIG. 7B

ENVIRONMENTAL CONDITION COMPREHENSION LEVEL

| RATING | CONTENTS | SCORE |
|---|---|---|
| a | SETTINGS ARE BASED ON SUFFICIENT DATA AND GROUNDS. | 1 |
| b | DATA AND GROUNDS ARE INSUFFICIENT AND ENVIRONMENTAL CONDITIONS ARE SET ON ANALOGY OF SIMILARITIES AND DOCUMENTS. | 2 |
| c | NO COMPREHENSION. ENVIRONMENTAL CONDITIONS ARE SET WITHOUT GROUNDS. | 4 |

FIG. 7C

VERIFICATION COMPREHENSION LEVEL

| RATING | VERIFICATION LEVEL | SCORE |
|---|---|---|
| a | LIMIT VERIFICATION | 0.5 |
| b | QT-LEVEL VERIFICATION | 1 |
| c | NONE | 1.5 |

FIG. 8

TECHNICAL COMPREHENSION LEVEL POINTS

|  | TOTAL SCORE | POINT |
|---|---|---|
| VERY LOW | 24 OR OVER | 8POINT |
| LOW | 12~18 | 4POINT |
| MIDDLE | 4~8 | 2POINT |
| HIGH | 2 OR LOWER | 1POINT |

| LARGE CLASSIFICATION | MIDDLE CLASSIFICATION | SMALL CLASSIFICATION | RISK EXTRACTION | CONTENTS | REASON | BASED DOCUMENT |
|---|---|---|---|---|---|---|
| SYSTEM COMPONENT | DESIGN, MANUFACTURE, TEST PROCUREMENT | MODEL | | | | |
| SYSTEM | DESIGN | PERFORMANCE | MAIN COMBUSTION CHAMBER CHUG STABILITY | CONDITIONS SUCH AS ΔPC AND TINJ TO GENERATE CHUG ARE UNCLEAR | LIMIT OF MODEL ACCURACY | JGM1-070105 |
| | | | REGENERATIVE COOLING PRESSURE LOSS CHARACTERISTIC | PRESSURE LOSS ESTIMATION UNDER VARIOUS OPERATING CONDITIONS | LIMIT OF MODEL ACCURACY | JGM1-070002 |
| | | | REGENERATIVE COOLING TEMPERATURE INCREASE CHARACTERISTIC | TEMPERATURE INCREASE ESTIMATION UNDER VARIOUS OPERATING CONDITIONS | LIMIT OF MODEL ACCURACY | JGM1-070002 |
| | | | REGENERATIVE COOLING WALL TEMPERATURE CHARACTERISTIC | WALL TEMPERATURE ESTIMATION UNDER VARIOUS OPERATING CONDITIONS | LIMIT OF MODEL ACCURACY | JGM1-070002 |
| | | | MAIN VALVE PRESSURE LOSS | VALVE PRESSURE LOSS FORECAST | UNCLEAR COMPONENT SPECIFICATIONS | JGM1-070002 |
| | | | GG CHUG STABILITY | CONDITIONS SUCH AS ΔPC AND TINJ TO GENERATE CHUG ARE UNCLEAR | LIMIT OF MODEL ACCURACY | JGM1-070105 |

FIG. 9B (FROM FIG. 9A)

| WORST SCENARIO | | | | | | | COUNTER PLAN | CONCRETE PLAN | RISK DIVERSIFICATION | 200701 | | | | | |
|---|---|---|---|---|---|---|---|---|---|---|---|---|---|---|---|
| SCENARIO WITHOUT COUNTERMEASURE | PHENOMENON | ENVIRONMENT | VERIFICATION | COMPREHENSION LEVEL | INFLUENCE LEVEL | INITIAL RISK | | | | PHENOMENON | ENVIRONMENT | VERIFICATION | COMPREHENSION LEVEL | INFLUENCE LEVEL | INITIAL RISK |
| | | | | | | | SAFETY ENHANCEMENT /AVOIDANCE | | | | | | | | |
| MISSION FAILURE IF OCCURRED DURING FLIGHT | 4 | 2 | 1.5 | 4 | 8 | 32 | AVOIDANCE | SETTING ΔPC | ROBUST DESIGN TO SUPPRESS ΔPC VARIATION | 2 | 2 | 1.5 | 2 | 4 | 8 |
| DELAY IN SCHEDULE DUE TO CHANGE IN PUMPVALVE PRESSURE DEMAND | 4 | 2 | 1.5 | 4 | 8 | 32 | SAFETY ENHANCEMENT | ACTUALLY MEASURING KEY FACTORS | MARGIN IN PUMP REVOLUTION SPEED CAPACITY | 4 | 2 | 1.5 | 4 | 5 | 20 |
| CORRECTION OF COMBUSTOR LENGTH TO MEET INJECTOR TEMPERATURE IF VALUE | 8 | 2 | 1.5 | 8 | 4 | 32 | SAFETY ENHANCEMENT | ACTUALLY MEASURING KEY FACTORS FOR COMBUSTOR | ELONGATING COMBUSTOR LENGTH FROM THE BEGINNING | 4 | 2 | 1.5 | 4 | 4 | 16 |
| REVIEW COMBUSTOR INNER CYLINDER THICKNESS DUE TO LIFE PROBLEM | 8 | 2 | 1.5 | 8 | 4 | 32 | SAFETY ENHANCEMENT | ACTUALLY MEASURING KEY FACTORS AND SETTING THEM LOWER | SHAKE-DOWN P DESIGN | 4 | 2 | 1.5 | 4 | 4 | 16 |
| CHANGE IN TP DEMAND | 2 | 2 | 1.5 | 2 | 4 | 8 | AVOIDANCE | SYSTEM ADJUSTMENT MARGIN (COVERING WITH CONTINGENCY) | PUMP CAPACITY MARGIN | 2 | 2 | 1.5 | 2 | 4 | 8 |
| MISSION FAILURE IF OCCURRED DURING FLIGHT | 4 | 2 | 1.5 | 4 | 8 | 32 | AVOIDANCE | SETTING ΔPg | ROBUST DESIGN | 2 | 2 | 1.5 | 2 | 4 | 8 |

Note (200701 leftmost cell): MIDDLE OF CONCEPTUAL DESIGN; remaining rows: LITERATURE EXAMINATION AND THEORETICAL MODEL (rows 2–5), ASSUMPTION ON BP BASE (row 6), LITERATURE EXAMINATION AND THEORETICAL MODEL (row 7).

FIG. 12

| | DESIGN PARAMETER | PRESENT VALUE | UNIT | RANGE | LEVEL 1 | LEVEL 2 | LEVEL 3 |
|---|---|---|---|---|---|---|---|
| MC RELATED | Rinjo FACTOR | 0.22 | [-] | 0.2~0.3 | 0.2 | 0.25 | 0.3 |
| | Rinjf FACTOR | 0.17 | [-] | 0.15~0.25 | 0.15 | 0.2 | 0.25 |
| | Pc | 5.2 | [MPa] | 4.5~5.5 | 4.5 | 5 | 5.5 |
| | L+x | 50 | [mm] | 0~200 | 0 | 150 | 300 |
| | εc | 3 | [-] | 2.5~3.5 | 2.5 | 3 | 3.5 |
| | Twg | 550 | [K] | 550~650 | 550 | 600 | 650 |
| EXHAUST GAS | Ptdo | 0.25 | [MPa] | 0.2~0.3 | 0.2 | 0.25 | 0.3 |
| GG | Rginjo FACTOR | 0.23 | [-] | 0.2~0.3 | 0.2 | 0.25 | 0.3 |
| | Rginjf FACTOR | 0.17 | [-] | 0.1~0.2 | 0.1 | 0.15 | 0.2 |
| | Pg FACTOR | 0.95 | [-] | 0.8~1.0 | 0.8 | 0.9 | 1 |
| | Tg | 730 | [K] | 700~800 | 700 | 750 | 800 |
| DUMMY | DUMMY ITEM 1  D1 | | [-] | 0~2 | 0 | 1 | 2 |
| | DUMMY ITEM 2  D2 | | [-] | 0~2 | 0 | 1 | 2 |
| CONTINGENCY | SELF PRESSURIZE SWITCH | 1 | [-] | 0,1 | 0 | — | 1 |
| | DUMP FLOW RATE | 0 | [kg/s] | 0~0.5 | 0 | 0.25 | 0.5 |
| | LIQUID GAS SWITCH | 1 | [-] | 0,1 | 0 | — | 1 |
| | REGENERATIVE COOLING BYPASS RATIO | 0 | [-] | 0.0~0.2 | 0 | 0.1 | 0.2 |
| | MR | 3.3 | [-] | 3.1~3.5 | 3.1 | 3.3 | 3.5 |
| | Pe/Pa | 0.35 | [-] | 0.3~0.4 | 0.3 | 0.35 | 0.4 |
| | OTPバイパス | 0.2 | [-] | 0~0.2 | 0 | 0.1 | 0.2 |

FIG. 13

| No | Rinjo FACTOR | Rinjf FACTOR | Pc | L+x | εc | Twg | Ptdo | Rginjo FACTOR | Rginjf FACTOR | Pg FACTOR | Tg |
|---|---|---|---|---|---|---|---|---|---|---|---|
| 1 | 0.2 | 0.15 | 4.5 | 0 | 2.5 | 550 | 0.2 | 0.2 | 0.1 | 0.8 | 700 |
| 2 | 0.2 | 0.15 | 5 | 150 | 3 | 600 | 0.25 | 0.2 | 0.1 | 0.9 | 750 |
| 3 | 0.2 | 0.15 | 5.5 | 300 | 3.5 | 650 | 0.3 | 0.2 | 0.1 | 1 | 800 |
| 4 | 0.2 | 0.2 | 4.5 | 150 | 3 | 600 | 0.3 | 0.25 | 0.15 | 0.8 | 700 |
| 5 | 0.2 | 0.2 | 5 | 300 | 3.5 | 650 | 0.2 | 0.25 | 0.15 | 0.9 | 750 |
| 6 | 0.2 | 0.2 | 5.5 | 0 | 2.5 | 550 | 0.25 | 0.25 | 0.15 | 1 | 800 |
| 7 | 0.2 | 0.25 | 4.5 | 300 | 3.5 | 650 | 0.25 | 0.3 | 0.2 | 0.8 | 700 |
| 8 | 0.2 | 0.25 | 5 | 0 | 2.5 | 550 | 0.3 | 0.3 | 0.2 | 0.9 | 750 |
| 9 | 0.2 | 0.25 | 5.5 | 150 | 3 | 600 | 0.2 | 0.3 | 0.2 | 1 | 800 |
| 10 | 0.25 | 0.15 | 4.5 | 0 | 3 | 650 | 0.2 | 0.25 | 0.2 | 0.9 | 800 |
| 11 | 0.25 | 0.15 | 5 | 150 | 3.5 | 550 | 0.25 | 0.25 | 0.2 | 1 | 700 |
| 12 | 0.25 | 0.15 | 5.5 | 300 | 2.5 | 600 | 0.3 | 0.25 | 0.2 | 0.8 | 750 |
| 13 | 0.25 | 0.2 | 4.5 | 150 | 3.5 | 550 | 0.3 | 0.3 | 0.1 | 0.9 | 800 |
| 14 | 0.25 | 0.2 | 5 | 300 | 2.5 | 600 | 0.2 | 0.3 | 0.1 | 1 | 700 |
| 15 | 0.25 | 0.2 | 5.5 | 0 | 3 | 650 | 0.25 | 0.3 | 0.1 | 0.8 | 750 |
| 16 | 0.25 | 0.25 | 4.5 | 300 | 2.5 | 600 | 0.25 | 0.2 | 0.15 | 0.9 | 800 |
| 17 | 0.25 | 0.25 | 5 | 0 | 3 | 650 | 0.3 | 0.2 | 0.15 | 1 | 700 |
| 18 | 0.25 | 0.25 | 5.5 | 150 | 3.5 | 550 | 0.2 | 0.2 | 0.15 | 0.8 | 750 |
| 19 | 0.3 | 0.15 | 4.5 | 0 | 3.5 | 600 | 0.2 | 0.3 | 0.15 | 1 | 750 |
| 20 | 0.3 | 0.15 | 5 | 150 | 2.5 | 650 | 0.25 | 0.3 | 0.15 | 0.8 | 800 |
| 21 | 0.3 | 0.15 | 5.5 | 300 | 3 | 550 | 0.3 | 0.3 | 0.15 | 0.9 | 700 |
| 22 | 0.3 | 0.2 | 4.5 | 150 | 2.5 | 650 | 0.3 | 0.2 | 0.2 | 1 | 750 |
| 23 | 0.3 | 0.2 | 5 | 300 | 3 | 550 | 0.2 | 0.2 | 0.2 | 0.8 | 800 |
| 24 | 0.3 | 0.2 | 5.5 | 0 | 3.5 | 600 | 0.25 | 0.2 | 0.2 | 0.9 | 700 |
| 25 | 0.3 | 0.25 | 4.5 | 300 | 3 | 550 | 0.25 | 0.25 | 0.1 | 1 | 750 |
| 26 | 0.3 | 0.25 | 5 | 0 | 3.5 | 600 | 0.3 | 0.25 | 0.1 | 0.8 | 800 |
| 27 | 0.3 | 0.25 | 5.5 | 150 | 2.5 | 650 | 0.2 | 0.25 | 0.1 | 0.9 | 700 |

FIG. 14

| P/N | COMBUSTOR LIFE MEAN | DEVIATION σ | η | CRITERIA SN | 30 R | GG LIFE MEAN | DEVIATION σ | η | CRITERIA SN | 30 R |
|---|---|---|---|---|---|---|---|---|---|---|
| 1 | 64.5293 9532 | 0.686348 | 36.19515 | 39.46427 | 50.30891 | 50.11705 | 0.396088 | 33.99971 | 42.04388 | 50.7893 |
| 2 | 50.3123 9832 | 0.53341 | 34.0335 | 39.49228 | 38.0803 | 46.7632 | 0.347796 | 33.38193 | 42.55545 | 47.9486 |
| 3 | 41.5284 0306 | 0.343999 | 32.3669 | 41.63575 | 33.51287 | 43.71176 | 0.329202 | 32.81197 | 42.46271 | 41.6514 |
| 4 | 62.0603 7438 | 0.678582 | 35.85629 | 39.22424 | 47.2461 | 49.96514 | 0.388988 | 33.97334 | 42.17462 | 51.3258 |
| 5 | 49.0640 7485 | 0.421313 | 33.81527 | 41.32317 | 45.24918 | 46.77697 | 0.317133 | 33.40064 | 43.37582 | 52.9020 |
| 6 | 43.7751 9624 | 0.383484 | 32.82456 | 41.14962 | 35.9212 | 43.83677 | 0.348508 | 32.83677 | 41.9925 | 39.7028 |
| 7 | 60.0959 1359 | 0.658886 | 35.57769 | 39.20069 | 45.67697 | 49.97452 | 0.347337 | 33.97497 | 43.15996 | 57.5076 |
| 8 | 51.9929 1037 | 0.520304 | 34.31888 | 39.99373 | 42.26932 | 46.72095 | 0.291662 | 33.39023 | 44.09264 | 57.3299 |
| 9 | 42.5298 9734 | 0.367557 | 32.57389 | 41.26739 | 34.08966 | 43.78726 | 0.336061 | 32.82695 | 42.2986 | 41.0260 |
| 10 | 64.8533 1201 | 0.735205 | 36.23864 | 38.91048 | 47.40628 | 43.84614 | 0.296116 | 33.98572 | 43.40939 | 46.7591 |
| 11 | 50.0984 1298 | 0.453549 | 33.99648 | 40.864 | 44.31366 | 50.03641 | 0.419922 | 33.98572 | 41.52235 | 47.7146 |
| 12 | 41.5774 2938 | 0.29386 | 32.37715 | 43.01435 | 39.39779 | 46.65069 | 0.468855 | 33.37716 | 39.95638 | 35.5134 |
| 13 | 62.3011 5572 | 0.686408 | 35.88992 | 39.15827 | 47.05821 | 43.76441 | 0.34264 | 32.82242 | 42.12567 | 40.1717 |
| 14 | 48.7385 0177 | 0.425724 | 33.75744 | 41.17487 | 44.01557 | 49.97754 | 0.454574 | 33.9755 | 40.82341 | 43.94787 |
| 15 | 43.7134 1873 | 0.374252 | 32.8123 | 41.34901 | 36.64219 | 46.72471 | 0.285821 | 33.39093 | 44.26906 | 58.5 1472 |
| 16 | 60.1549 3393 | 0.608979 | 35.58543 | 39.89337 | 49.51717 | 43.78771 | 0.334787 | 32.82705 | 42.33167 | 41.18354 |
| 17 | 51.8324 7811 | 0.44643 | 34.29204 | 41.29697 | 48.90461 | 50.03779 | 0.42801 | 33.98596 | 41.35688 | 46.81617 |
| 18 | 42.4191707 | 0.350 779 | 32.55124 | 41.65057 | 35.40455 | 46.71621 | 0.323371 | 33.38935 | 43.19532 | 51.69352 |
| 19 | 64.7900 6854 | 0.730742 | 36.23017 | 38.95489 | 47.60926 | 46.77872 | 0.342882 | 33.40097 | 42.69807 | 48.93438 |
| 20 | 50.3510 5336 | 0.474872 | 34.04017 | 40.50864 | 42.85585 | 43.76903 | 0.315077 | 32.82334 | 42.855 | 43.7 004 8 |
| 21 | 41.4140 252 | 0.324332 | 32.34295 | 42.12314 | 35.19237 | 49.96583 | 0.400625 | 33.97346 | 41.91871 | 49.8367 5 |
| 22 | 62.2427 9312 | 0.751163 | 35.88178 | 38.36709 | 42.9238 | 46.70361 | 0.350187 | 33.38701 | 42.501 | 47.6991 |
| 23 | 49.0049 7986 | 0.39173 | 33.8048 | 41.94507 | 48.51553 | 43.76656 | 0.307353 | 32.82285 | 43.0701 | 44.7906 9 |
| 24 | 43.2129 6038 | 0.368763 | 32.71228 | 41.37734 | 35.83052 | 50.00634 | 0.333191 | 33.9805 | 43.52663 | 60.04461 |
| 25 | 60.0836 4808 | 0.668754 | 35.57513 | 39.06979 | 44.9846 | 46.67579 | 0.342132 | 33.38183 | 42.69797 | 48.74086 |
| 26 | 52.1941 3237 | 0.485369 | 34.35243 | 40.63099 | 45.72627 | 43.77607 | 0.296726 | 32.82474 | 43.37761 | 46.42684 |
| 27 | 42.2827 8952 | 0.381744 | 32.52327 | 40.88782 | 32.17544 | 49.98855 | 0.455701 | 33.97741 | 40.80382 | 43.86333 |

FIG. 15

SECOND-ORDER REGRESSION ANALYSIS RESPONSE SURFACE FUNCTION GROUP

| PARAMETER | PARAMETER LEVEL | | COMBUSTOR LIFE | | | CRITERIA 30 | |
|---|---|---|---|---|---|---|---|
| | | 0 | MEAN | DEVIATION $\sigma$ | $\eta$ | SN | R |
| Rinjo FACTOR | 2ND ORDER | | 1.941938114 | 9.355122 | 0.512127 | −177.952 | −825.598 |
| | 1ST ORDER | | −1.12356753 | −3.76029 | −0.31414 | 72.41834 | 334.0827 |
| | 0TH ORDER | | 0.143799418 | 0.36226 | 0.041489 | −7.06898 | −32.4166 |
| Rinjf FACTOR | 2ND ORDER | | 106.9658235 | 2.272873 | 10.24513 | −28.4053 | −208.417 |
| | 1ST ORDER | | −38.6104406 | −0.7791 | −3.59789 | 7.325508 | 62.60437 |
| | 0TH ORDER | | 3.206558684 | 0.061937 | 0.292092 | −0.41237 | −4.35391 |
| Pc | 2ND ORDER | | 2.02150007 | 0.060469 | 0.182883 | −0.43119 | −3.27571 |
| | 1ST ORDER | | −28.118962 | −0.71179 | −3.30955 | 5.114673 | 23.67221 |
| | 0TH ORDER | | 84.25228575 | 1.938251 | 11.06768 | −13.997 | −38.0081 |

FIG. 21

|  | UNIT | NOMINAL VALUE | MAXIMUM VALUE | MINIMUM VALUE |
|---|---|---|---|---|
| SYSTEM |  |  |  |  |
| THRUST | kN | 98.00 | 100.76 | 95.24 |
| ISPeng | sec | 354.77 | 358.89 | 350.65 |
| MReng |  | 2.85 | 3.06 | 2.63 |
| LIFE | TIME | 42.59 | 45.94 | 39.24 |

PRODUCT DESIGN SUPPORT SYSTEM AND METHOD FOR SIMULATING A PROTOTYPE OF A DESIGN OBJECT

TECHNICAL FIELD

The present invention relates to a product design support system and method for a high-technology product such as a rocket engine system.

BACKGROUND TECHNOLOGY

For example, designing a high-technology product such as a rocket engine system needs high reliability, and for this, an evaluation result of reliability must be fed back to the design and the design must include a reliability index and a technique of surely examining the adequacy thereof. Fundamental technologies necessary for that include a systematic risk management technology, a simulation technology, an L & L, a detailed FMEA (Failure Mode and Effects Analysis), various element tests, systematic databases for system test data and material characteristic data, and a reliability verification test technology.

Each design phase is required to achieve the below-mentioned objects. Conceptual design and basic design phases are required to carry out systematic system analyses, thorough risk identification, and design policy extraction so as to properly set required specifications for components. Phases that follow detailed design are required to carry out the detailed FMEA to precisely inspect all drawings and specification information and feed results thereof back to specifications for subsystems and components. A development test phase is required to verify estimated results, prove reliability, and eliminate identified failure mode risks.

Conventional design methods employ one-point designing, and therefore, are unable to meet such high-reliability design requirements.

[Patent Document 1] Japanese Unexamined Patent Application Publication No. 2000-331035

[Patent Document 2] Japanese Unexamined Patent Application Publication No. H08-166876

[Patent Document 3] Japanese Unexamined Patent Application Publication No. 2006-31488

[Patent Document 4] Japanese Unexamined Patent Application Publication No. H02-150972

[Patent Document 5] Japanese Unexamined Patent Application Publication No. 2006-11729

[Patent Document 6] Japanese Unexamined Patent Application Publication No. H10-149384

DISCLOSURE OF INVENTION

The present invention has been made in consideration of the conventional technical problems and an object thereof is to provide a product design support system and method capable of designing and developing in a short time a high-technology product that needs high-reliability design.

An aspect of the present invention provides a product design support system having an input device for data input operation, an output device for data display and printout, a data hold device having a program hold unit for holding a program library and a data storage unit for holding data, and a computer main body for getting data inputted with the input device and data held in the data hold device, invoking a proper program from the program library held in the data hold device, and executing the program. The system includes a parameter set/register unit to receive design parameters of a design object inputted with the input device and register the design parameters in the data hold device, an orthogonal table creation unit to execute an orthogonal table creation program with the use of the design parameters registered in the data hold device, create an orthogonal table having L rows whose number corresponds to the number of the parameters, and register the orthogonal table in the data hold device, a dimensions operation unit to invoke and execute a dimensions determination program from the data hold device with the use of data of the L-row orthogonal table, determine dimensions of each part of the design object with respect to design points of the L rows of the orthogonal table so as to achieve design target values, and register the dimensions in the data storage unit, a simulation execution unit to invoke a simulation program for the design object from the data hold device, execute many times, for each of L sets of design solutions obtained by the dimensions operation unit, a virtual prototyping operation by adjusting the dimensions of each part registered in the data hold unit within tolerances, and register the simulation results in the data hold unit, an evaluation index operation unit to read the design parameters, parts dimensions, and simulation results from the data hold unit, invoke and execute an evaluation index operation program for the design object, compute evaluation indexes corresponding to the set design parameters, and register the evaluation indexes in the data hold unit, a response surface model operation unit to invoke a response surface operation program from the data hold device, process averages and variances of the L sets of evaluation indexes obtained by the simulation execution unit, form a response surface and response surface model, and register the response surface model in the data hold device, a factorial effect diagram making unit to read the L-row orthogonal table and evaluation indexes from the data hold device, execute a factorial effect diagram making program from the data hold device, make a factorial effect diagram of design parameters for each evaluation index, display and output the factorial effect diagrams, and register them in the data hold device, a design solution group computation unit to execute a design solution search program held in the data hold device with respect to an operation input that specifies design parameters sensitive to the evaluation indexes, prepare optional combinations of the design parameters, apply the combinations to the response surface model registered in the data hold device, thoroughly find many design solutions by optionally combining all design parameters that may achieve the design target values, and register the design solutions in the data hold device, a filtering unit to receive an operation input that specifies an optional number of evaluation index limit values, invoke and execute a filtering program from the data hold device, extract a maximum likelihood design solution candidate group that achieves the specified evaluation index limit values out of the design solution group obtained by the design solution group computation unit, and register the maximum likelihood design solution candidate group in the data hold device, and a maximum likelihood design solution group select unit to receive a maximum likelihood design solution group select command that specifies one or plural kinds of evaluation indexes with respect to the maximum likelihood design solution candidate group filtered by the filtering unit, select a maximum likelihood design solution group that satisfies the specified evaluation indexes out of the maximum likelihood design solution candidate group, and register the maximum likelihood design solution group in the data hold device.

The product design support system mentioned above may have a recommended design solution find unit that receives an input for specifying design parameters for a recommended design solution, executes the simulation program and evaluation index operation program with the use of the specified design parameters to compute an evaluation index for the recommended design solution, displays the computed result on the output device, and registers the same in the data hold device.

Also, the product design support system mentioned above may have a parameter comprehension level register unit to display on the output device a setting screen for setting user's comprehension levels about a plurality of parameters of the dimensions determination program and simulation program, receive the user's comprehension levels set and inputted on the setting screen, and register the same in a risk database held in the data hold device, a parameter influence level register unit to display on the output device a setting screen for setting influence levels of ambiguity in the plurality of parameters of the dimensions determination program and simulation program on design solutions of the design object, receive the influence levels on design solutions of the design object set and inputted on the setting screen, and register the same in the risk database held in the data hold device, a risk level operation unit to compute risk levels of design solutions of the design object with the use of the user's comprehension level and influence level of each parameter, and a risk database management unit to make a list of the names of the plurality of parameters, the set and registered user's comprehension levels and influence levels on design solutions of the design object, and the computed risk levels and output and display the list on the output device.

Further, the risk database management unit of the product design support system mentioned above may make a risk level transition list that relates the names of the plurality of parameters, the set and registered user's comprehension levels and influence levels on design solutions of the design object, and the computed risk levels to the dates and times of input and computation and outputs and displays the list.

Another aspect of the present invention provides a product design support method including a parameter registration step of receiving inputted design parameters of a design object and registering them in a data hold device, an orthogonal table creation step of using the design parameters registered in the parameter registration step in the data hold device, executing an orthogonal table creation program, and creating an orthogonal table having L rows corresponding to the number of the parameters, a dimensions operation step of invoking and executing a dimensions determination program from the data hold device with the use of data of the L-row orthogonal table, determining dimensions of each part of the design object with respect to design points of the L rows of the orthogonal table so as to achieve design target values, and registering the dimensions in the data hold device, a simulation step of invoking a simulation program for the design object from the data hold device, executing many times, for each of L sets of design solutions obtained by the dimensions operation step, a virtual prototyping operation by adjusting the dimensions of each part registered in the data hold unit within tolerances, and registering the simulation results in the data hold device, an evaluation index operation step of reading the design parameters, parts dimensions, and simulation results from the data hold device, invoking and executing an evaluation index operation program for the design object, computing evaluation indexes corresponding to the set design parameters, and registering the evaluation indexes in the data hold device, a response surface model operation step of invoking a response surface operation program from the data hold device, processing averages and variances of the L sets of evaluation indexes obtained by the simulation step, forming a response surface and response surface model, and registering the response surface model in the data hold device, a factorial effect diagram making step of reading the L-row orthogonal table and the evaluation indexes computed in the evaluation index operation step from the data hold device, executing a factorial effect diagram making program from the data hold device, making a factorial effect diagram of design parameters for each evaluation index, and registering the factorial effect diagrams in the data hold device, a design solution group computation step of receiving an operation input that specifies design parameters sensitive to the evaluation indexes, executing a design solution search program held in the data hold device, preparing optional combinations of the design parameters, applying the combinations to the response surface model registered in the data hold device, thoroughly finding many design solutions by optionally combining all design parameters that may achieve the design target values, and registering the design solutions in the data hold device, a filtering step of invoking and executing a filtering program from the data hold device in the design solution group computation step, receiving an operation input that specifies an optional number of evaluation index limit values, extracting a maximum likelihood design solution candidate group that achieves the specified evaluation index limit values out of the design solution group obtained in the design solution group computation step, and registering the maximum likelihood design solution candidate group in the data hold device, and a maximum likelihood design solution group select step of receiving a maximum likelihood design solution group select command that specifies one or plural kinds of evaluation indexes with respect to the maximum likelihood design solution candidate group filtered in the filtering step, selecting a maximum likelihood design solution group that satisfies the specified evaluation indexes out of the maximum likelihood design solution candidate group, and registering the maximum likelihood design solution group in the data hold device.

The product design support method mentioned above may include a recommended design solution finding step of receiving an input for specifying design parameters for a recommended design solution, executing the simulation program and evaluation index operation program with the use of the specified design parameters to compute an evaluation index for the recommended design solution, registering the computed result in the data hold device, and outputting the computed result to an output device.

Also, the product design support method mentioned above may include a parameter comprehension level register step of displaying on the output device a setting screen for setting user's comprehension levels about a plurality of parameters of the dimensions determination program and simulation program, receiving the user's comprehension levels set and inputted on the setting screen, and registering the same in a risk database held in the data hold device, a parameter influence level register step of displaying on the output device a setting screen for setting influence levels of ambiguity in the plurality of parameters of the dimensions determination program and simulation program on design solutions of the design object, receiving the influence levels on design solutions of the design object set and inputted on the setting screen, and registering the same in the risk database held in the data hold device, a risk computation step of computing risk levels of design solutions of the design object with the use of the user's comprehension level and influence level of each parameter, and a risk management step of making a list of the names of the plurality of parameters, the set and registered user's comprehension levels and influence levels on design solutions of the design object, and the computed risk levels and outputting and displaying the list on the output device.

Further, the risk management step of the product design support method mentioned above may include making a risk level transition list that relates the names of the plurality of parameters, the set and registered user's comprehension levels and influence levels on design solutions of the design object, and the computed risk levels to the dates and times of input and computation and outputting and displaying the list.

The product design support system and method of the present invention are capable of supporting product design work in such a way as to design and develop in a short time a high-technology product that needs high design reliability.

In addition, the product design support system and method of the present invention are capable of supporting product design work by progressively correcting various parameters of the dimensions determination program and simulation program through product design stages, to minimize risk factors in a final design stage.

BRIEF DESCRIPTION OF DRAWINGS

FIG. 5 is an explanatory view of a risk registration screen provided by the product design support system according to the second embodiment.

FIG. 6 is an explanatory view of a risk reduction plan setting screen provided by the product design support system according to the second embodiment.

FIG. 7A is a rating-score correspondence table of phenomenon comprehension level among set parameter comprehension levels related to the product design support system according to the second embodiment.

FIG. 7B is a rating-score correspondence table of environmental condition comprehension level among the set parameter comprehension levels related to the product design support system according to the second embodiment.

FIG. 7C is a rating-score correspondence table of verification comprehension level among the set parameter comprehension levels related to the product design support system according to the second embodiment.

FIG. 8 is a score-point correspondence table of technique comprehension level related to the product design support system according to the second embodiment.

FIG. 9A is a part of a risk management table outputted from the product design support system according to the second embodiment.

FIG. 9B is the other part of the risk management table outputted from the product design support system according to the second embodiment.

FIG. 12 is an explanatory view of a parameter setting screen provided by the product design support system according to the example 1.

FIG. 13 is an L-27 orthogonal table created by the product design support system according to the example 1.

FIG. 14 is an explanatory view of an evaluation index list outputted from the product design support system according to the example 1.

FIG. 15 is a list of response surface function group created by the product design support system according to the example 1.

FIG. 21 is a specification table of a recommended design solution provided by the product design support system according to the example 1.

BEST MODE OF IMPLEMENTING INVENTION

The embodiments of the present invention will be explained in detail with reference to the drawings.

(First Embodiment)

Figure 1:
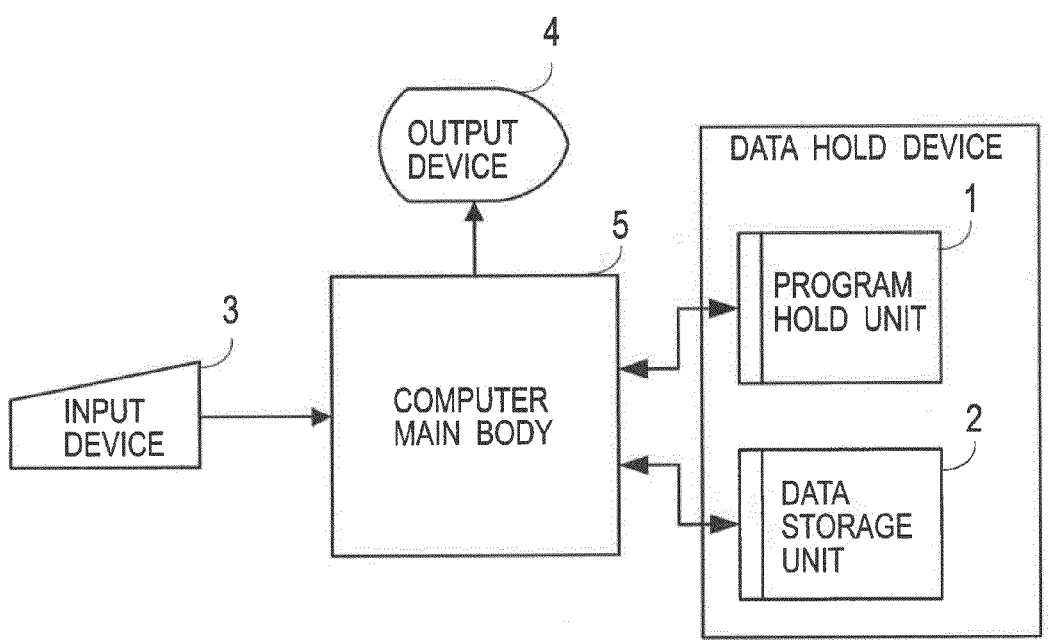
FIG. 1 is a block diagram of a hardware configuration of a product design support system according to a first embodiment of the present invention.

FIG. 1 illustrates a product design support system used for a product design support method according to the first embodiment of the present invention. The product design support system of this embodiment is realized by installing software programs that achieve the product design support method of the embodiment in a general-purpose computer system and by executing the programs. Hereunder, the system is explained as an exclusive system.

The product design support system to carry out the product design support method of the embodiment includes a program hold unit 1 to hold libraries of exclusive programs for generally designing a design object which may be a high-technology product, programs for designing many parts, and simulation programs for simulating operation of the design object with input parameters, a data storage unit 2 to hold various kinds of data such as many kinds of input parameters, evaluation indexes, and simulation results, a data input device 3 that is an HMI such as a keyboard and a mouse, a data output device 4 such as a display and a printer, and a computer 5 to read a proper program out of the program hold unit 1, execute the same, and carry out various operations. The computer 5 may be connected to other computer systems through a network, to transmit and receive data to and from the other computer systems.

Figure 2:
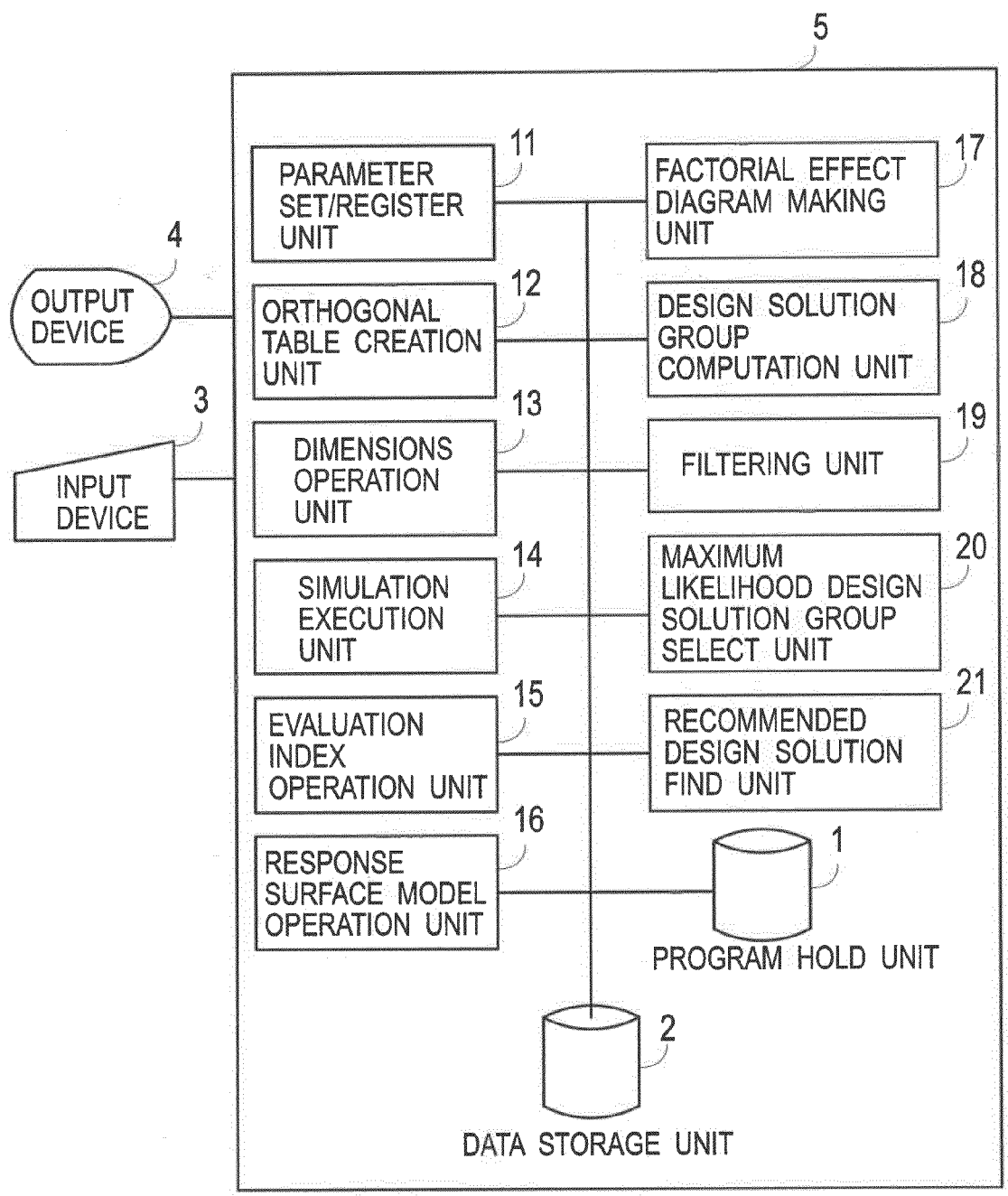
FIG. 2 is a block diagram of a functional configuration of the product design support system according to the first embodiment.

FIG. 2 illustrates a functional configuration of the product design support system according to the embodiment. The product design support system includes a parameter set/register unit 11 to carry out various operational processes to be explained later, an orthogonal table creation unit 12, a dimensions operation unit 13, a simulation execution unit 14, an evaluation index operation unit 15, a response surface model operation unit 16, a factorial effect diagram making unit 17, a design solution group computation unit 18, a filtering unit 19, a maximum likelihood design solution group select unit 20, and a recommended design solution find unit 21.

The parameter set/register unit 11 receives design parameters for a design object inputted by a user or a design engineer with the input device 3 and output device 4 and registers the design parameters in the data storage unit 2.

The orthogonal table creation unit 12 executes an orthogonal table creation program held in the program hold unit 1 with the use of the design parameters registered in the data storage unit 2, creates an orthogonal table having L rows whose number depends on the number of the parameters, and registers the orthogonal table in the data storage unit 2. The orthogonal table creation function will be explained later.

The dimensions operation unit 13 employs data of the L-row orthogonal table, invokes and executes a dimensions determination program from the program hold unit 1, determines the dimensions of each part of the design object in such a way as to achieve design target values for design points of L rows of the orthogonal table, and registers the dimensions in the data storage unit 2.

The simulation execution unit 14 invokes a simulation program for the design object from the program hold unit 1, executes many times, for each of L sets of models provided by the dimensions operation unit 13, a virtual prototyping operation by adjusting the dimensions of each part registered in the data storage unit 2 within tolerances, and registers the simulation results in the data storage unit 2.

The evaluation index operation unit 15 reads the design parameters, parts dimensions, and simulation results from the data storage unit 2, executes an evaluation index operation program for the design object from the program hold unit 1, computes evaluation indexes corresponding to the set design parameters, and registers the evaluation indexes in the data storage unit 2.

The response surface model operation unit 16 invokes a response surface operation program from the program hold unit 1, processes averages and variances of the L sets of evaluation indexes provided by the simulation execution unit 14, forms a response surface and response surface model, and registers the same in the data storage unit 2.

The factorial effect diagram making unit 17 reads the L-row orthogonal table and evaluation indexes from the data storage unit 2, executes a factorial effect diagram forming program held in the program hold unit 1, makes a factorial effect diagram of the design parameters for each evaluation index, displays and outputs the factorial effect diagram, and registers the same in the data storage unit 2.

The design solution group computation unit 18 executes a design solution search program held in the program hold unit 1 with respect to an operation input that is entered by the user who examines the displayed, outputted, and printed out factorial effect diagram of the design parameters for each evaluation index and specifies design parameters sensitive to each evaluation index, prepares optional combinations of design parameters, applies the combinations to the response surface model registered in the data storage unit 2, thoroughly finds many design solutions by optionally combining all design parameters that may achieve the design target values, and registers the design solutions in the data storage unit 2.

The filtering unit 19 invokes and executes a filtering program from the program hold unit 1, receives an input specifying evaluation index limit values related to, for example, a system life, operational stability, system performance, and robustness, extracts a maximum likelihood design solution candidate group that may achieve the specified evaluation index limit values out of the design solution group provided by the design solution group computation unit 18, and registers the solution candidate group in the data storage unit 2.

The maximum likelihood design solution group select unit 20 receives a maximum likelihood design solution group select command that is entered by the user to specify one or plural kinds of evaluation indexes such as the system life, operational stability, and system performance with respect to the maximum likelihood design solution candidate group filtered by the filtering unit 19, selects a maximum likelihood design solution group that satisfies the specified evaluation indexes out of the maximum likelihood design solution candidate group, and registers the maximum likelihood design solution group in the data storage unit 2.

The recommended design solution find unit 21 uses design parameters that are specified by the user who refers to the maximum likelihood design solution group selected by the maximum likelihood design solution group select unit 20 and specifies with the input device 3 design parameters for a design solution recommendable to a customer, executes the simulation program and evaluation index operation program with the use of the specified design parameters, computes an evaluation index for the recommended design solution, displays the same on a display of the output device 4, registers the same in the data storage unit 2, and makes a printer of the output device 4 print out the same depending on a request by the user.

Figure 3A:
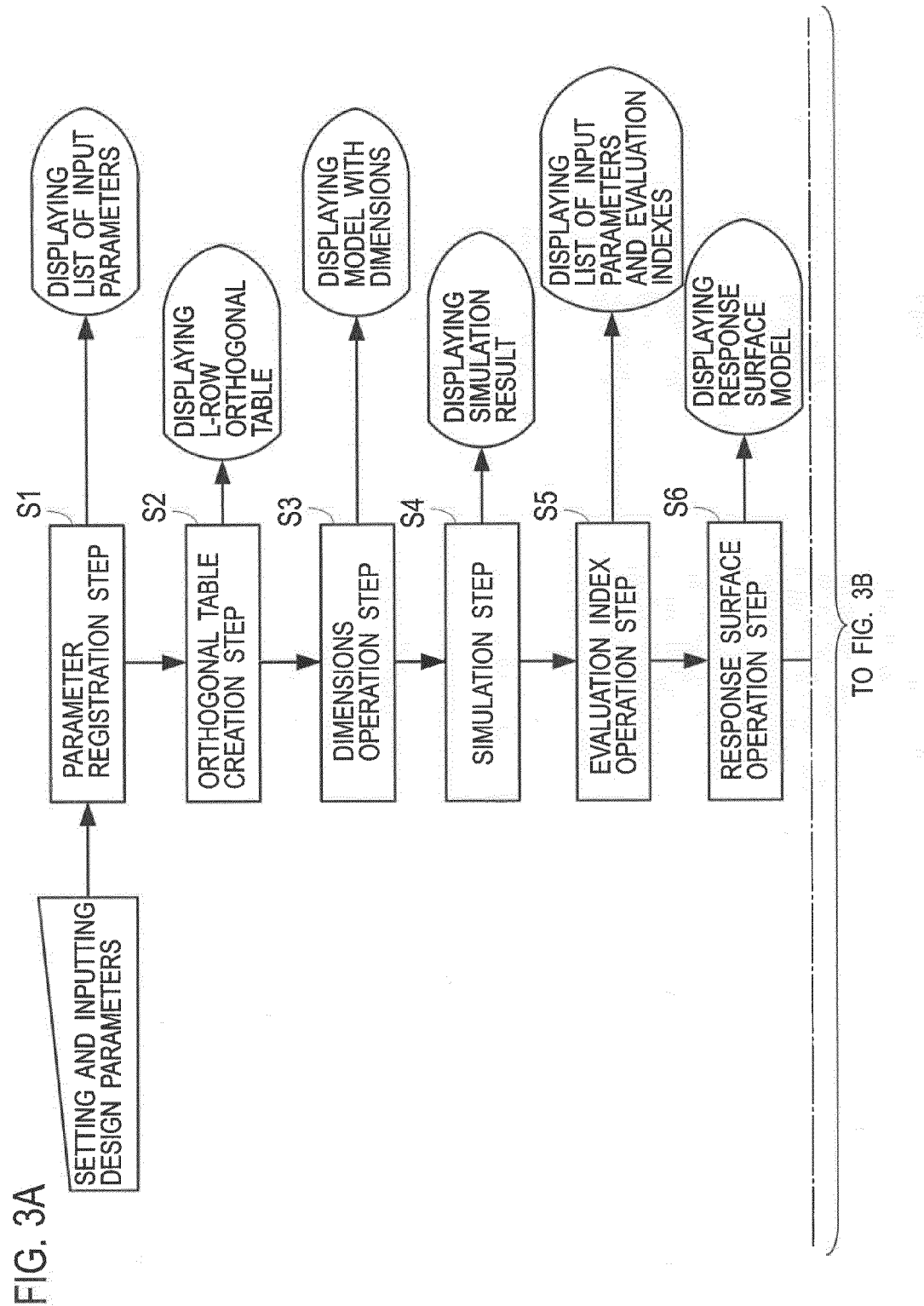
FIG. 3A is a first half of a flowchart of a product design support method achieved by the product design support system according to the first embodiment.
Figure 3B:
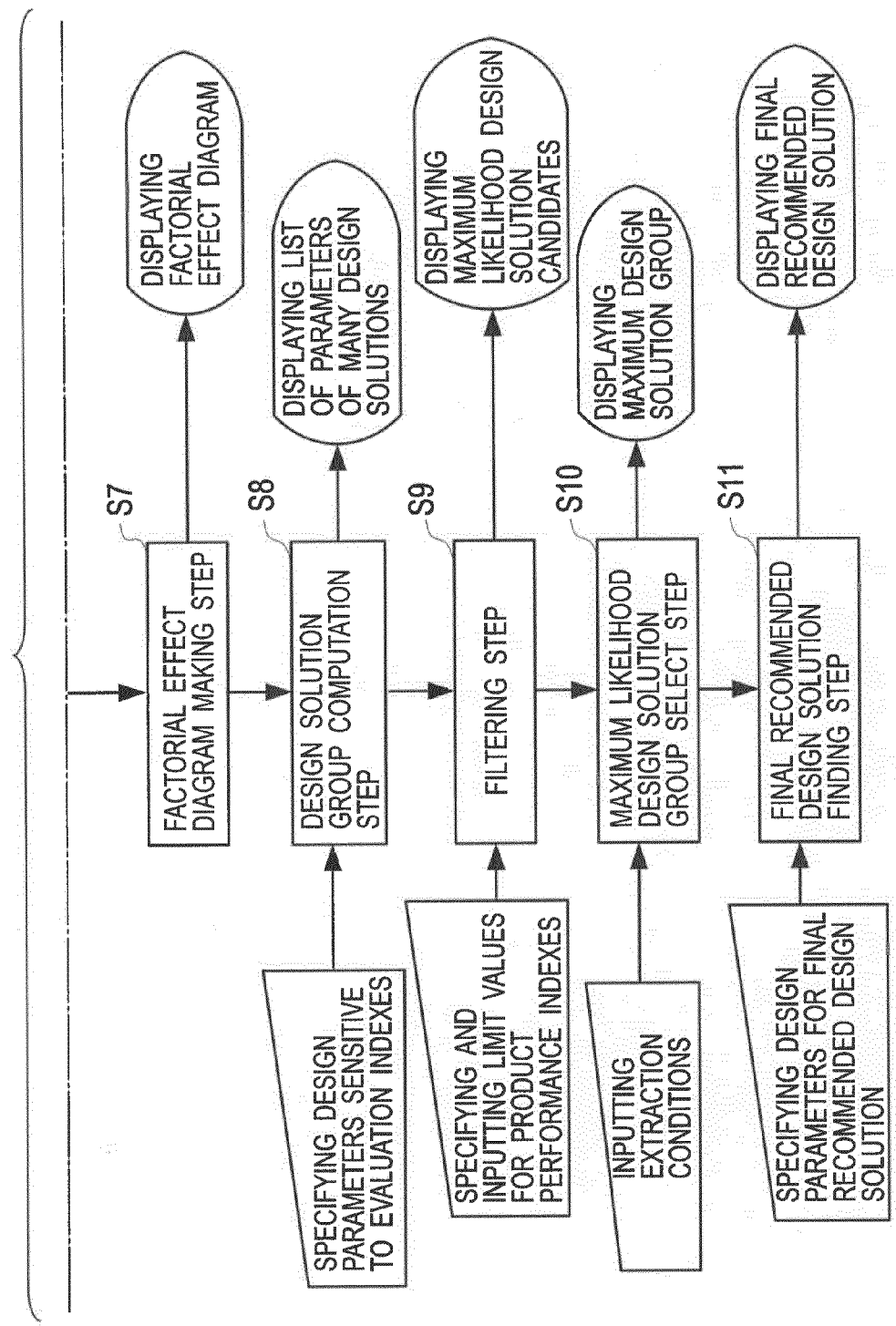
FIG. 3B is a second half of the flowchart of the product design support method achieved by the product design support system according to the first embodiment.

The product design support method carried out by the product design support system of the above-mentioned configuration will be explained with reference to the flowcharts of FIGS. 3A and 3B.

Step S1 is a parameter registration step of receiving design parameters for a design object inputted by a user or a design engineer with the input device 3 and output device 4 and registering the design parameters in the data storage unit 2.

Step S2 is an orthogonal table creation step of executing an orthogonal table creation program held in the program hold unit 1 with the use of the design parameters registered in step S1 in the data storage unit 2 and creating an orthogonal table having L rows corresponding to the number of the parameters. For example, if there are 13 parameters, an orthogonal table having L=27 rows is created. If the number of the parameters increases, a higher-order orthogonal table is created accordingly. The orthogonal table is to evenly select design parameters from among an enormous amount of design parameter combinations and find the influence of each design parameter with a small number of trials. The orthogonal table having L=27 rows is able to contain 27 kinds of different design parameter combinations.

Step S3 is a dimensions operation step of employing data of the L-row orthogonal table obtained in step S2, invoking and executing a dimensions determination program from the program hold unit 1, determining the dimensions of each part of the design object with respect to design points of the L rows of the orthogonal table so as to achieve design target values, and registering the dimensions in the data hold device 2.

Step S4 is a simulation step of invoking a simulation program for the design object from the program hold unit 1, executing many times, for each of L sets of design solutions of the L-row orthogonal table obtained in step S3, a virtual prototyping operation by adjusting the dimensions of each part registered in the data storage unit 2 within tolerances, and registering the simulation results in the data storage unit 2.

Step S5 is an evaluation index operation step of reading the design parameters from the data storage unit 2, executing an evaluation index operation program for the design object from the program hold unit 1, computing evaluation indexes corresponding to the set design parameters, and registering the evaluation indexes in the data storage unit 2.

Step S6 is a response surface model operation step of invoking a response surface operation program from the program hold unit 1, processes averages and variances of the L sets of evaluation indexes obtained in step S5, forming a response surface and response surface model, and registering the same in the data storage unit 2.

Step S7 is a factorial effect diagram creation step of reading the L-row orthogonal table obtained in step S2 and the evaluation indexes computed in step S5, executing a factorial effect diagram making program held in the program hold unit 1, making a factorial effect diagram of design parameters for each evaluation index, and registering the same in the data storage unit 2.

Step S8 is a design solution group computation step of executing a design solution search program held in the program hold unit 1 for design parameters that are specified by the user who examines the factorial effect diagram of design parameters for each evaluation index made in step S7 and specifies design parameters sensitive to the evaluation indexes, preparing optional combinations of the design parameters, applying the combinations to the response surface model registered in the data storage unit 2, thoroughly finding many design solutions by optionally combining all design parameters that may achieve the design target values, and registering the design solutions in the data storage unit 2.

Step S9 is a filtering step of invoking and executing a filtering program from the program hold unit 1, receiving an input specifying evaluation index limit values related to, for example, a system life, operational stability, system performance, and robustness, extracting a maximum likelihood design solution candidate group that may achieve the specified evaluation index limit values from the design solution group obtained in step S8, and registering the same in the data storage unit 2.

Step S10 is a maximum likelihood design solution group select step of receiving a maximum likelihood design solution group select command that is entered by the user to specify one or plural kinds of evaluation indexes with respect to the maximum likelihood design solution candidate group filtered in step S9, selecting a maximum likelihood design solution group that satisfies the specified evaluation indexes out of the maximum likelihood design solution candidate group, and registering the maximum likelihood design solution group in the data storage unit 2.

Step S11 is a recommended design solution finding step of using design parameters that are specified by the user who refers to the maximum likelihood design solution group selected in step S10 and specifies design parameters for a design solution recommendable to a customer, executing the simulation program and evaluation index operation program with the use of the specified design parameters, computing an evaluation index for the recommended design solution, displaying the same on a display of the output device 4, registering the same in the data storage unit 2, and outputting the same to a printer of the output device 4 depending on a request from the user.

As mentioned above, the product design support system according to the embodiment and the product design support method carried out by the same are capable of designing a high-technology product that needs complicated high techniques by letting the user specify design parameters and select evaluation indexes and design parameters in each design stage, by preparing a maximum likelihood design solution group that satisfies the given evaluation indexes with the use of the entered design parameters, and by providing a final recommended design solution. For example, when designing a given design object, the best performance of the object will be achievable, in some case, by sacrificing the life, stability, and robustness of the object. In this case, the embodiment can propose a customer a well-balanced design solution that achieves a second best performance and is excellent in life, stability, and robustness.

(Second Embodiment)

A product design support system and product design support method according to the second embodiment of the present invention will be explained. The product design support system and the product design support method carried out by the system according to this embodiment are characterized in that, when preparing a product dimensions determination program or a product simulation program, for example, they let a user register a risk index according to a user's certainty factor for each parameter set by the user and display and print out a list of the names and risk levels of the risk-set parameters, thereby providing the user with the risk levels and risk reduction transition of the dimensions determination program and simulation program in each product design stage such as an initial design stage, a sub-model experimental production stage, and a full-model experimental production stage.

Figure 4:
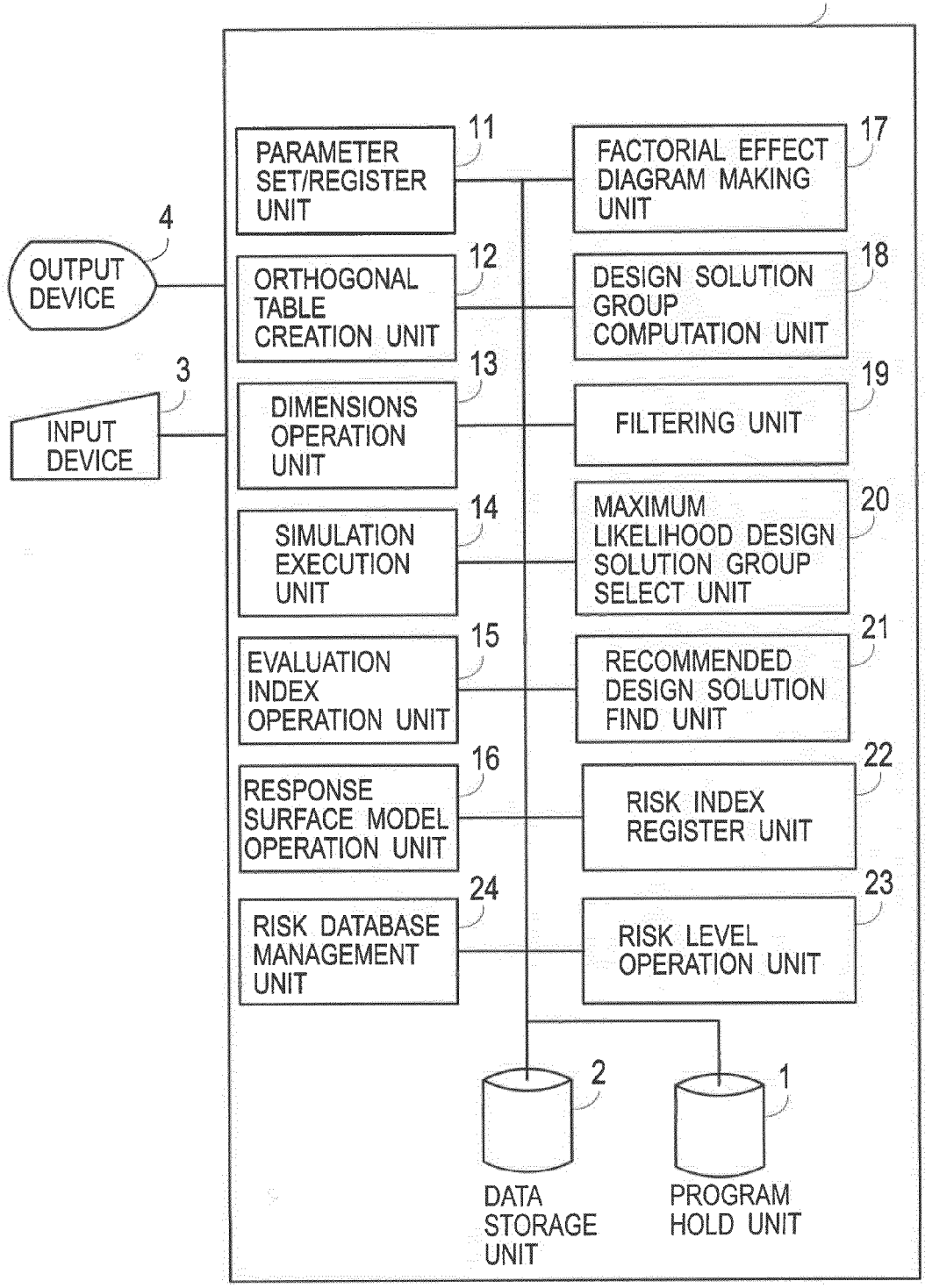
FIG. 4 is a block diagram of a functional configuration of a product design support system according to a second embodiment of the present invention.

A hardware configuration of the product design support system according to the embodiment is provided by the computer system illustrated in FIG. 1 like the first embodiment. A functional configuration of the product design support system is illustrated in FIG. 4 and includes, in addition to the elements of the first embodiment, a risk index registration unit 22 having a function of displaying on a display a risk registration screen illustrated in FIG. 5 for each parameter with respect to a computation model such as a dimensions determination program and a simulation program, letting a user or an engineer set and input an assurance level or a confidence level for the set parameter, for example, a "phenomenon comprehension level", "environment comprehension level", and "verification comprehension level", and registering the inputted data in a risk database in a data hold device 2 and a function of letting the user input the degree of influence of each risk-set parameter on a final system with the risk registration screen and registering the inputted data in the risk database. The risk index registration unit 22 serves as the parameter comprehension level register unit and parameter influence level register unit stipulated in the claims.

The product design support system of the embodiment also includes a risk level operation unit 23 that operates a calculation formula of "phenomenon comprehension level"×"environmental condition comprehension level"×"verification comprehension level" with respect to the ratings and scores of the "phenomenon comprehension level" inputted by the risk index registration unit 22 and illustrated in FIG. 7A, the "environmental condition comprehension level" illustrated in FIG. 7B, and the "verification comprehension level" illustrated in FIG. 7C, computes the "technical comprehension level" according to a conversion table illustrated in FIG. 8, displays the operation results at corresponding parts of the risk registration screen, registers the same in the risk database in the data storage unit 2, operates a risk level with the use of the registered parameters, technical comprehension level, and influence level, displays the risk level in a risk level display section of the risk registration screen, and registers the risk level in the risk database.

The product design support system of the embodiment further includes a risk database management unit 24 that makes a list of the names of various parameters, the set and registered user's comprehension levels and influence levels on design solutions of the design object, and the computed risk levels registered in the risk database and displays the list on the display of an output device 4. Further, the risk database management unit 24 makes a risk level transition list illustrated in FIGS. 9A and 9B containing the names of various parameters, the set and registered user's comprehension levels and influence levels on design solutions of the design object, the computed risk levels, and the date and time of input and computation, displays the list on the display of the output device 4, and if the user instructs, prints out the list with a printer of the output device 4.

The product design support method carried out by the product design support system according to the embodiment conducts risk management through procedures mentioned below.

(1) Model Preparation

A computation model is registered in a simulation program. Various parameters are set and registered with a parameter set/register unit 11.

(2) Setting Risk Related Indexes for Internal Parameters of Computation Model

Figure 5:
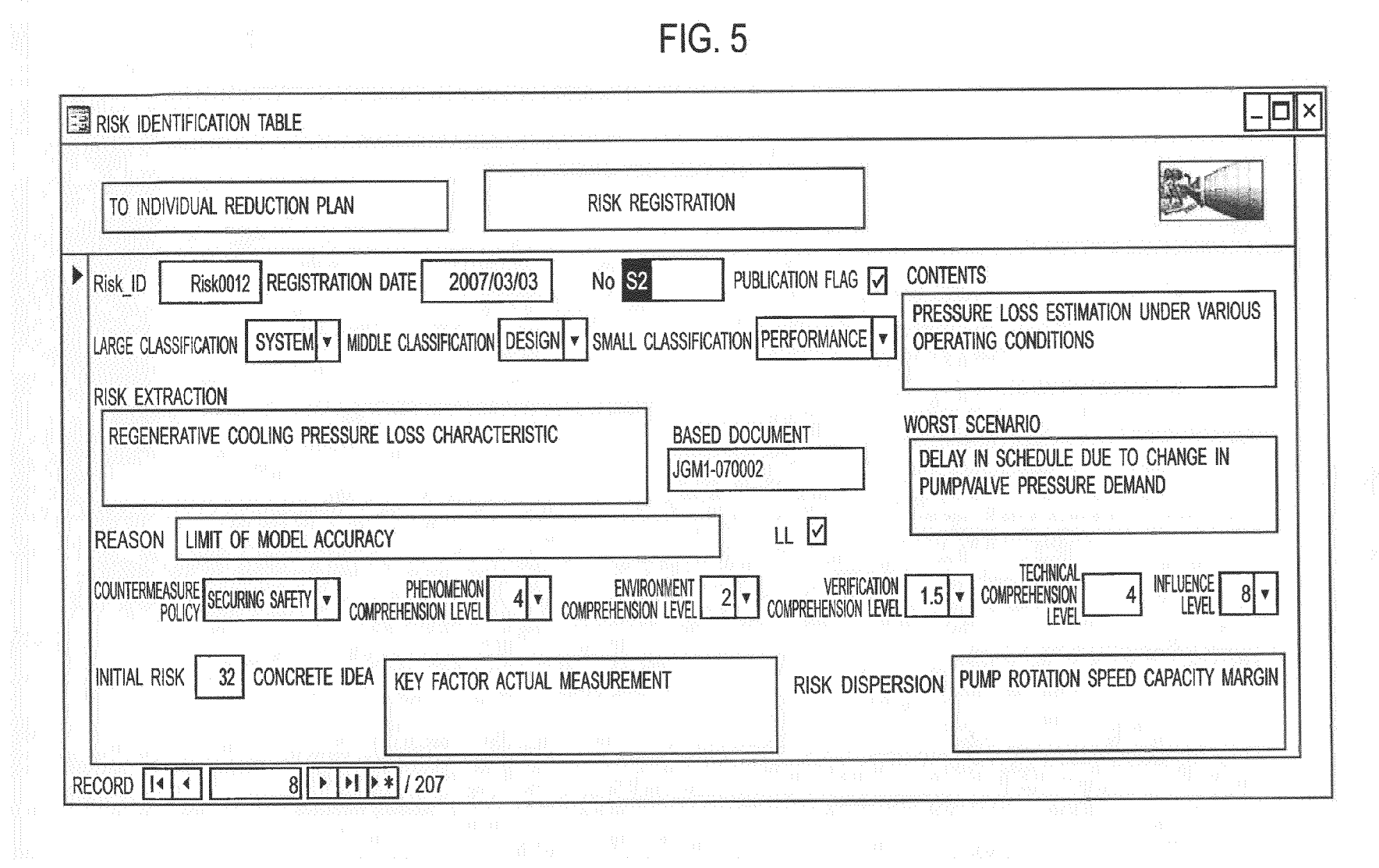

The risk register screen illustrated in FIG. 5 is displayed on the display of the output device 4. For each computation model, internal parameters are set and the above-mentioned risk indexes for the selected internal parameters are set. The risk indexes are those that reflect user's confidence levels or assurance levels with respect to assumed values for various parameters set for the computation model. The "influence level" is set to indicate what will happen if the assumed values take presumable worst values. These are carried out with the risk index register unit 22.

This embodiment defines that technical comprehension level="phenomenon comprehension level"×"environmental condition comprehension level"×"verification level". The risk related indexes of the "phenomenon comprehension level" illustrated in FIG. 7A, the "environmental condition comprehension level" illustrated in FIG. 7B, and the "verification comprehension level" illustrated in FIG. 7C are inputted as scores corresponding to rankings. Then, "technical comprehension level" points for the scores are computed according to the above-mentioned definitional formula and the table of FIG. 8.

(3) Influence Level Analysis

The influence of interface conditions and variations in the internal parameters on the outputs, characteristics, performance, and the like of the system is examined according to a result of execution of the simulation program and is inputted as an influence level point. This is also set by the risk index register unit 22.

After the technical comprehension level point of (2) and the influence level point are found, a risk is obtained as the product thereof. Using the risk register screen illustrated in FIG. 5, an engineer inputs the names and risk related indexes of all possible necessary parameters. The risk level operation unit 23 operates risk levels for all of the inputted parameters, reflects them to the corresponding sections of the risk register screen displayed on the display, and registers them in the risk database.

The risk related indexes set and registered for the respective parameters so far can be displayed on the display as a risk list illustrated as an example in FIGS. 9A and 9B, if the user requests. This function is carried out by the risk database management unit 24.

(4) Corrective Operation

Extents of undoing the outputs, characteristics, and performance of the system are examined by the user by intentionally specifying and correcting related parameters and executing a simulation program.

(5) Examination of Gains and Losses

Gains and losses due to the corrective operation are evaluated. (For example, Pareto solution is clarified.)

If the corrective operation is effective, the "influence level" is lowered.

(6) Extraction of Impermissible Risk

An event in which a corrective operation greatly affects the gains and losses, outputs, characteristics, performance, and the like of the system is identified for each parameter and is registered as a risk management record with a countermeasure plan. For example, in the risk list of FIGS. 9A and 9B, various parameters that have been set according to documents at the time of conceptual designing of a simulation program are corrected when executing element tests, to increase confidence levels and reduce resultant risks. In component sub-scale tests, various parameters of computation models are strictly corrected to further reduce risks. FIG. 6 illustrates a risk reduction plan for specific parameters.

The parameter correction is carried out by the parameter set/register unit 11 and a simulation execution unit 14 to execute a simulation program. Other necessary operation processes are carried out like the first embodiment.

In this way, the product design support system and method of the embodiment obtain a design solution whose risk is reduced in an allowable range in a product design stage, and according to the same, can make a prototype model of the design object. Even before making the prototype model, it is possible to examine a risk reduction with a virtual prototype model and obtain a maximum likelihood design solution of the design object including risk information about various parameters residing in the solution.

EXAMPLE

Figure 10:
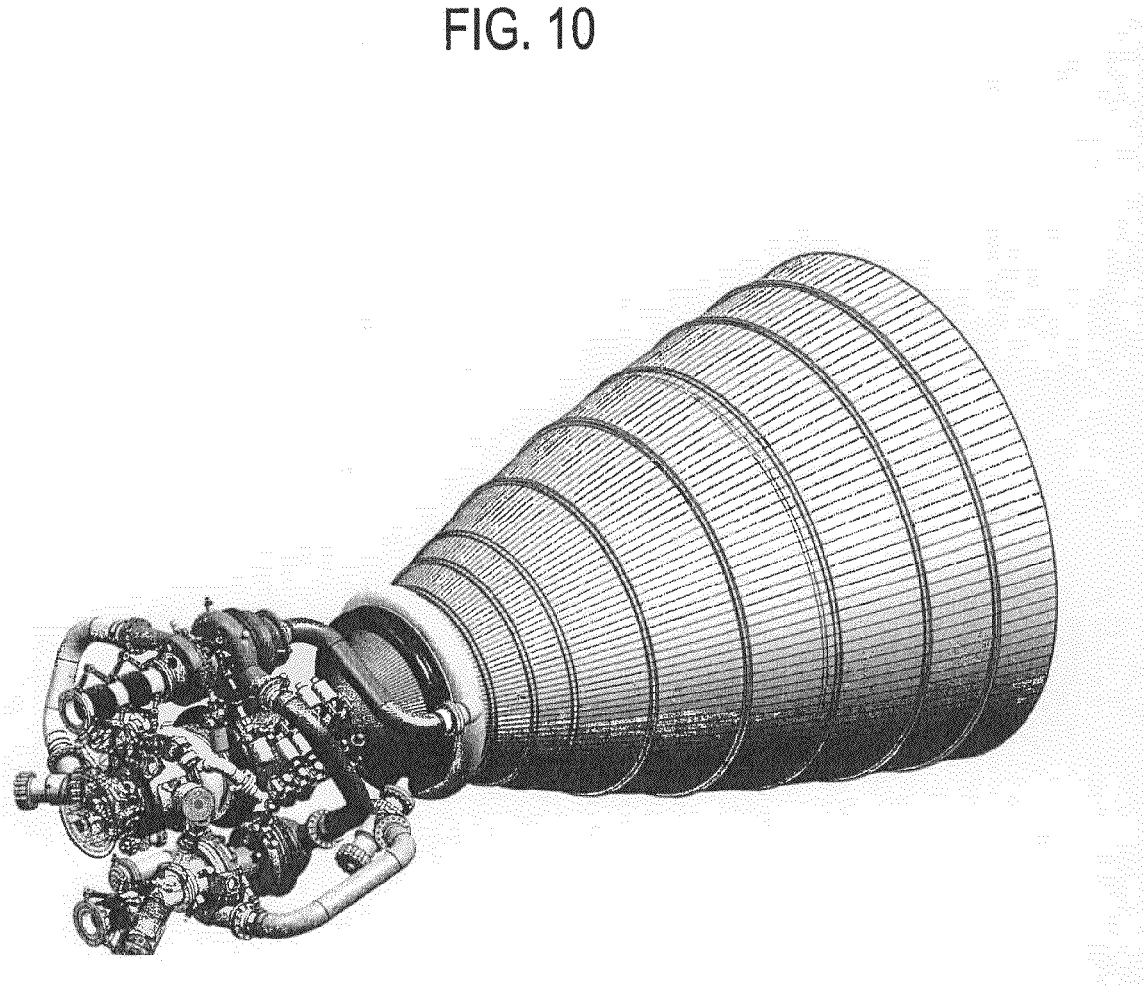
FIG. 10 is a solid model based on a maximum likelihood design solution of a design object provided by the product design support system according to an example 1 of the present invention.

For a rocket engine illustrated in FIG. 10, a design is made for a steady operation that occupies 98% of a rocket combustion time. Namely, a steady operation point design is carried out.

Figure 11:
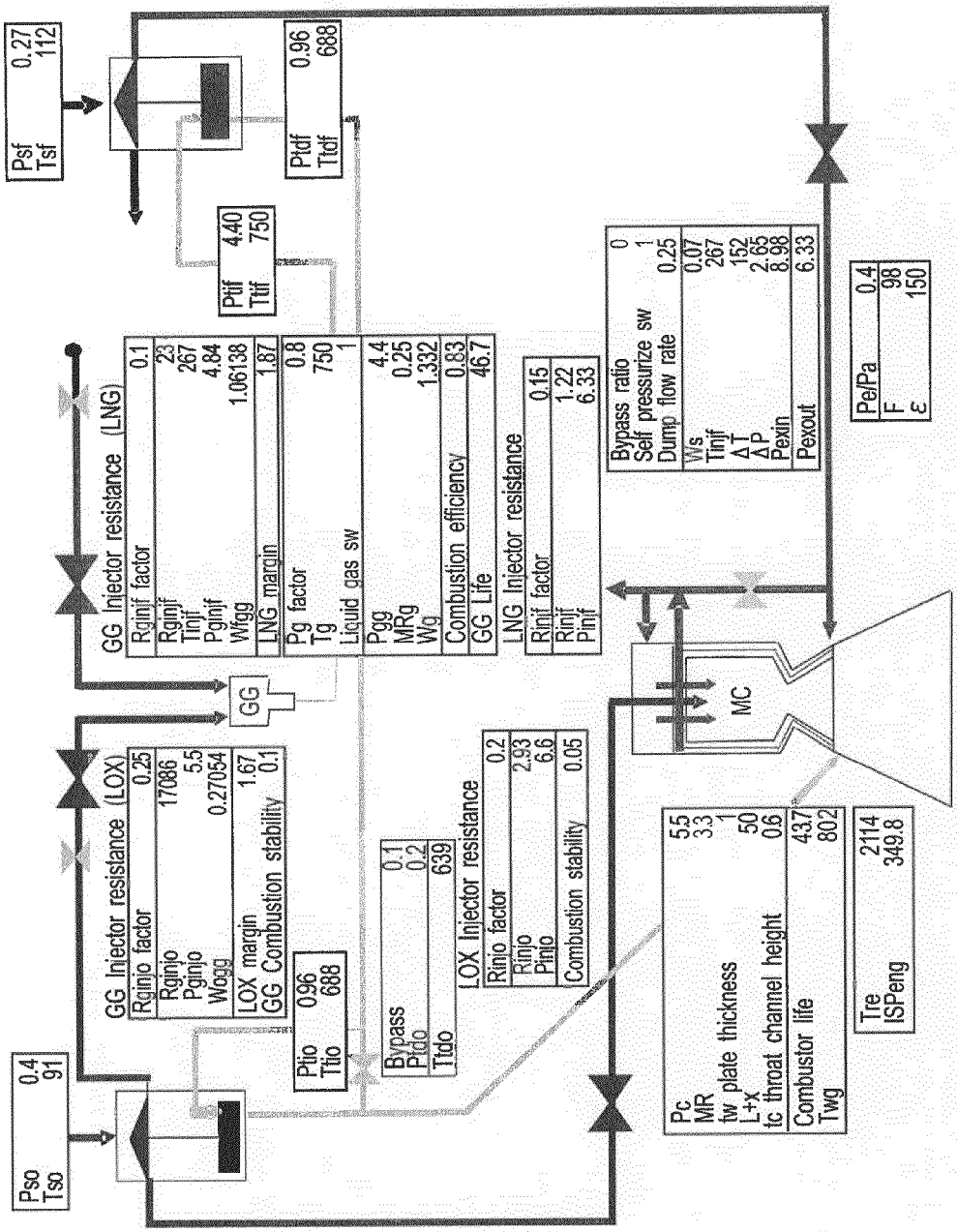
FIG. 11 is a steady-state computation system of a design object according to the product design support system of the example 1.

A steady operation point computation can be made by separately considering a part related to initialization functions such as ignition, and therefore, can be achieved with a single systematic diagram illustrated in FIG. 11 by extracting necessary items.

The systematic diagram of FIG. 11 is used as a systematic diagram of the design object and design parameters of parts that must be set and their ranges are inputted. FIG. 12 is a list illustrating the set design parameters and their ranges.

With the use of the design parameter group of FIG. 12, an L-27 orthogonal table is employed to obtain 27 kinds of different design parameter combinations. FIG. 13 illustrates the L-27 orthogonal table.

For the 27 design points, a dimensions determination program is executed to determine dimensions of representative points so as to generate a thrust of 10 tons. A simulation program is used to carry out many times a virtual prototyping operation with the use of dimensions prepared by adding actual tolerances to the determined dimensions.

FIG. 14 illustrates an evaluation index group obtained by executing an evaluation index operation program on each result of the virtual prototyping.

Figure 16:
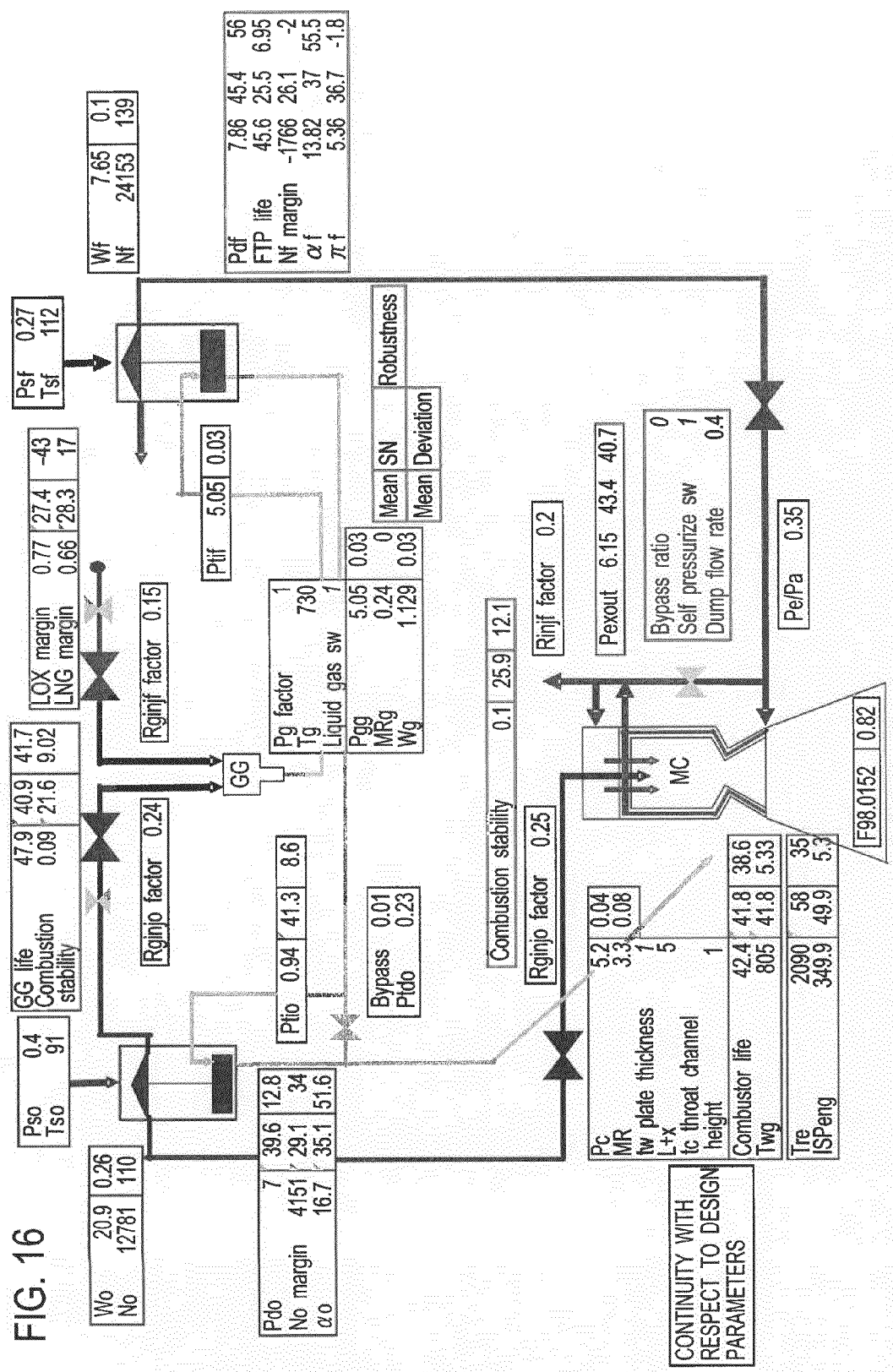
FIG. 16 is a system diagram based on a response surface model provided by the product design support system according to the example 1.

Average values and variances of the 27 sets of evaluation indexes obtained by the above simulation are processed to form a response surface model. This is an approximation model obtained by interpolating the 27 sets of average values and variances and is usable to quicken computations to be carried out next. The L-27 orthogonal table allows statistic quantities and state quantities to be interpolated within the ranges of the design parameters of FIG. 12. The influence level of each value is determined according to the number of prototypes 100×9=900 data pieces. In this stage, the system is expressed with a simple quadratic function sum. FIG. 15 illustrates a part of a coefficient table of all influence level coefficients (response surface function group). FIG. 16 illustrates the response surface model. By substituting design parameters for the same, the average value and variance of physical quantities of an evaluation index are instantaneously obtained.

Figure 17:
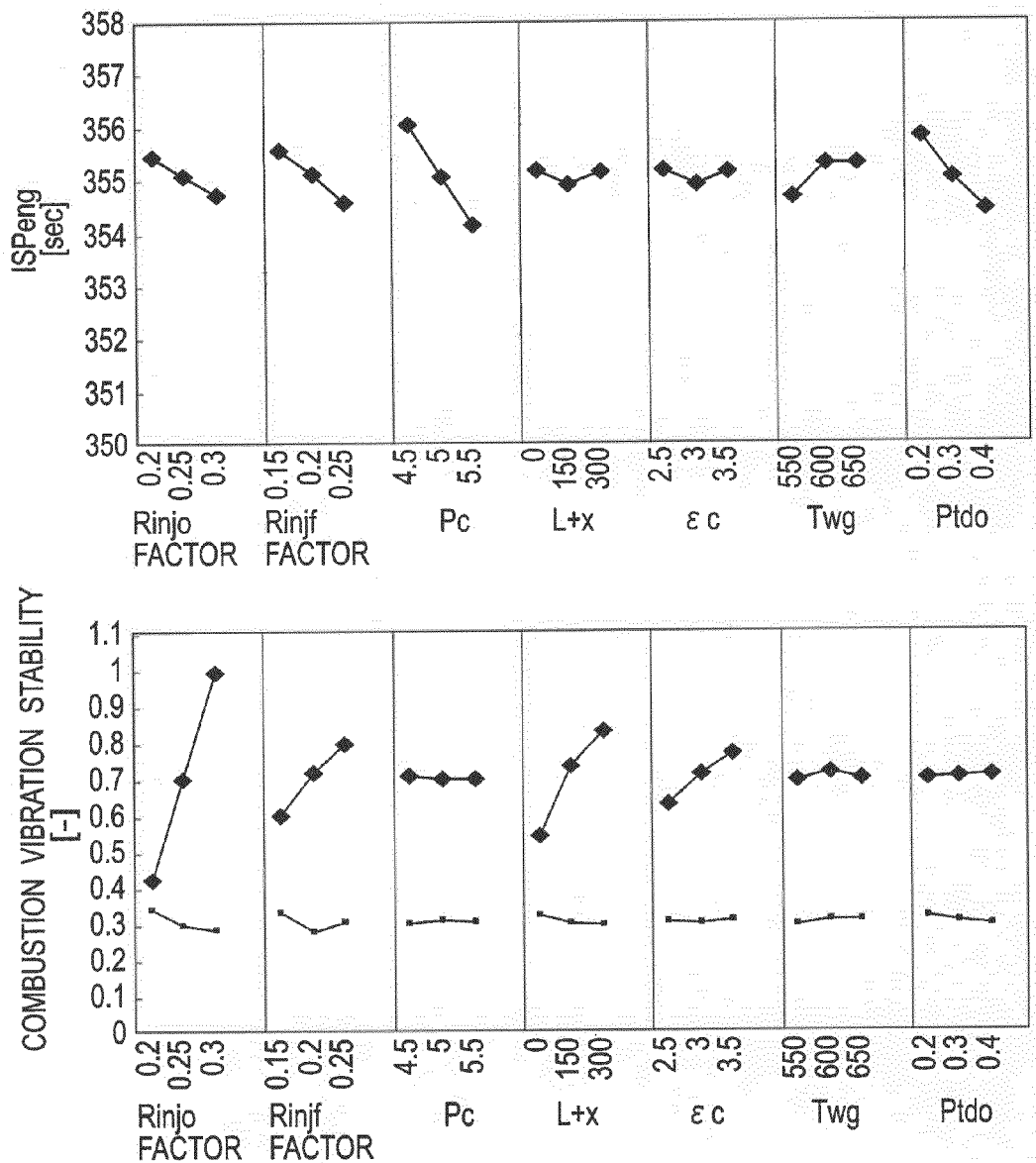
FIG. 17 illustrates factorial effect diagrams of the influence of set parameters on evaluation indexes provided by the product design support system according to the example 1.

A factorial effect diagram illustrated in FIG. 17 is prepared for each evaluation index based on the response surface model, to indicate a change caused by a change in a design parameter. The factorial effect diagram is used to examine the design parameter and identify a parameter that has a possibility of being accidentally selected although it has no sensitivity. Among initially selected 11 design parameters, two design parameters have small influence on the engine system or have determined influence directions, and therefore, are fixed in this stage. The remaining 9 design parameters are varied to find maximum likelihood solutions.

Figure 18:
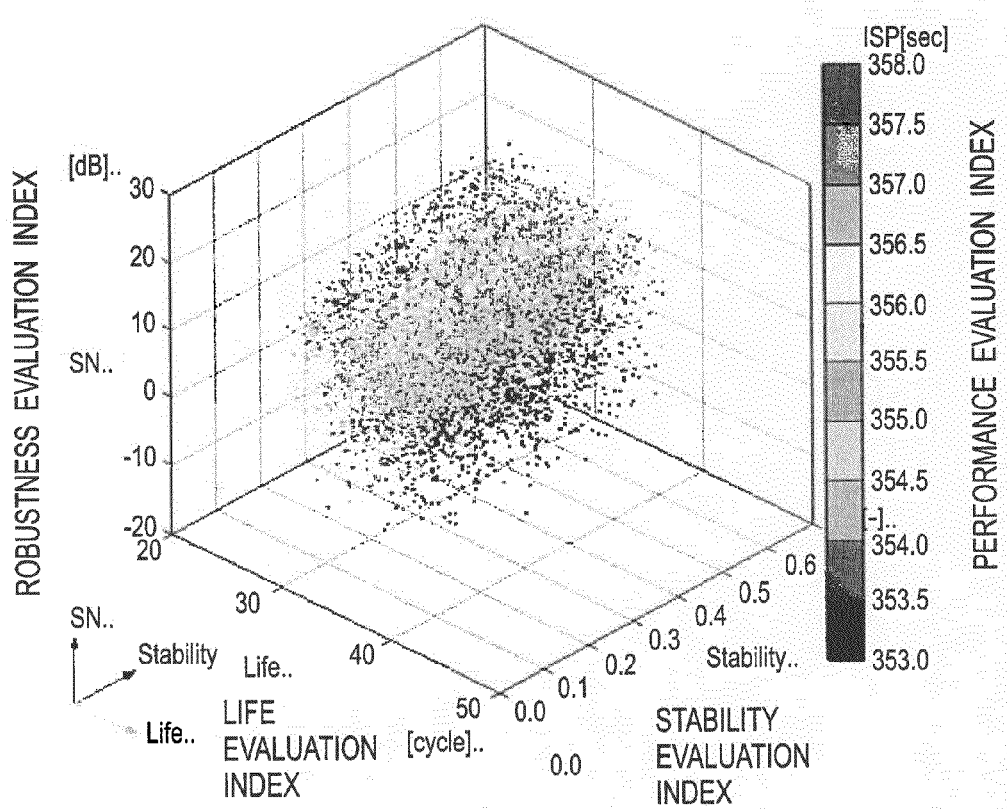
FIG. 18 is a three-dimensional distribution diagram in a whole evaluation index space illustrating 10000 design solutions created by changing all design parameters within set ranges with respect to the response surface model provided by the product design support system according to the example 1.
Figure 19:
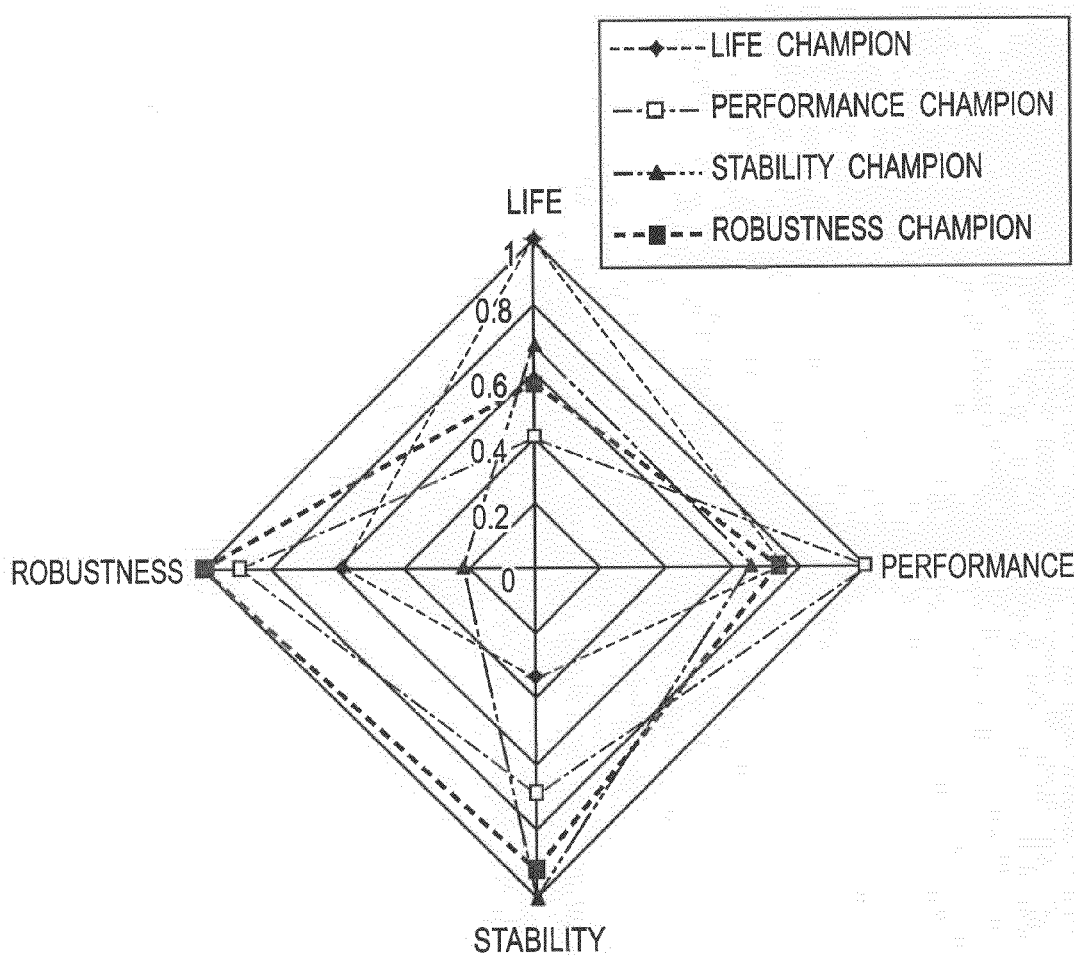
FIG. 19 is a radar graph of champion data of evaluation indexes obtained from the 10000 design solutions created by changing all design parameters within set ranges with respect to the response surface model provided by the product design support system according to the example 1.

For this, the response surface model enables an optional combination of the design parameters to instantaneously provide the averages and variances of evaluation indexes and state quantities. The 9 design parameters are thoroughly varied to virtually form 10000 models. FIG. 18 illustrates them. Each point on this three-dimensional graph indicates a design solution of the rocket engine having a thrust of 10 tons. The 10000 design solutions are classified according to four evaluation indexes including life, performance, stability, and robustness and champion data thereof are obtained. FIG. 19 indicates the champion data.

Figure 20:
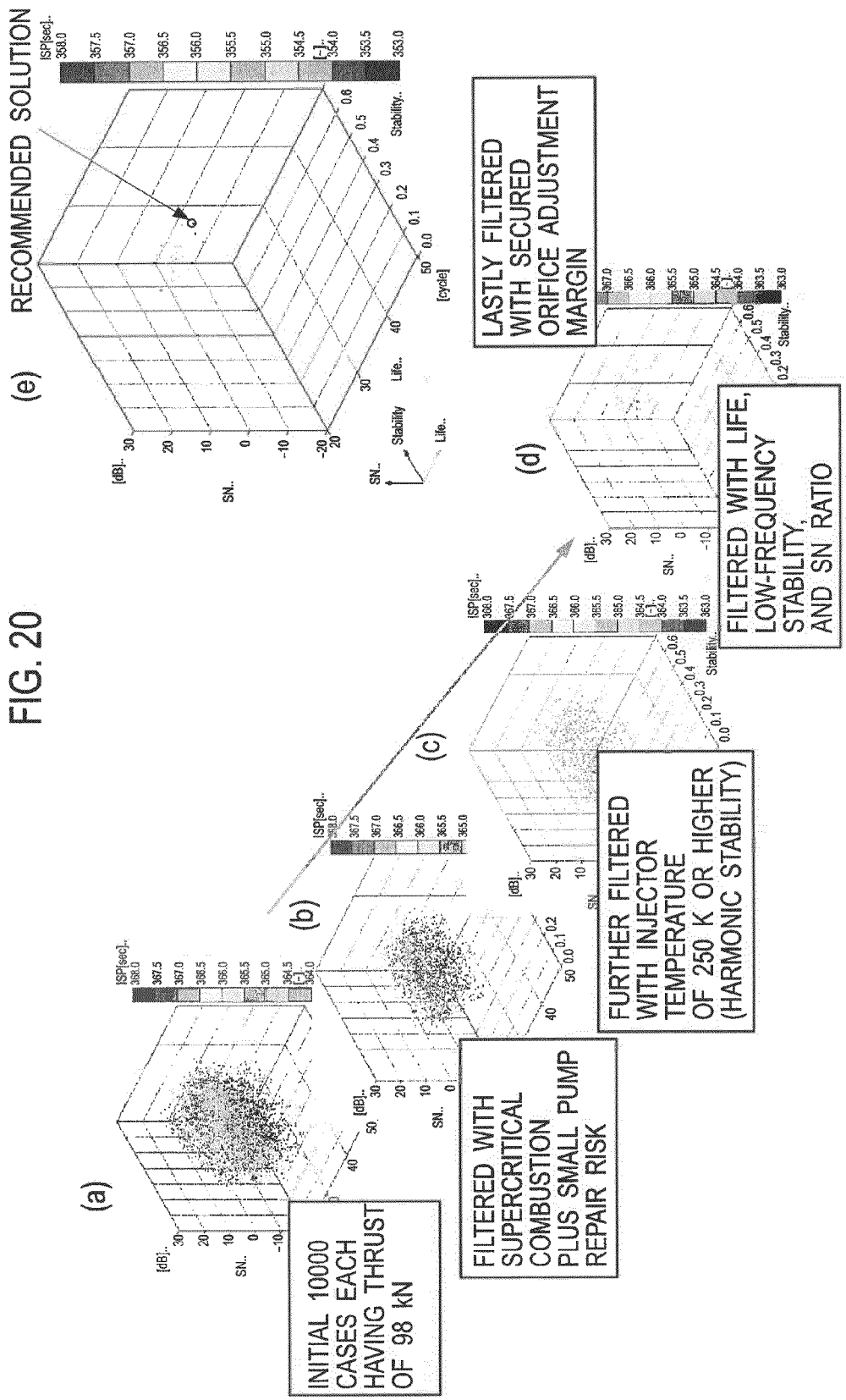
FIG. 20 is an explanatory view illustrating a progress of filtering conducted by the product design support system according to the example 1.

Thereafter, filtering is carried out to obtain a design solution intended by the designer. Namely, as illustrated in FIG. 20, from among the 10000 design solutions of FIG. 20(a), filtering is carried out with conditions of supercritical combustion (harmonic stability)+small pump repair risk as illustrated in FIG. 20(b), filtering is further carried out with a condition of an injector temperature of 250 K or higher (harmonic stability) as illustrated in FIG. 20(c), filtering is further carried out with conditions of life, low-frequency stability, and SN ratio as illustrated in FIG. 20(d), and final filtering is carried out with a condition of securing an orifice adjusting margin as illustrated in FIG. 20(e). Finally, a set (27 pieces) of well-balanced maximum likelihood design solutions is obtained.

With respect to the maximum likelihood design solution group, the original design parameters are examined to determine a combination of design parameters for a recommended design solution. With respect to this, the dimensions determination program and evaluation index operation program are executed, to fix dimensions. An external view of an engine of the recommended design solution designed according to the above-mentioned operation points is that illustrated in FIG. 10. Specifications of the recommended design solution are partly illustrated in FIG. 21.

Evaluation examples of the steady operation point design result are as mentioned below.

The life of a combustor is secured to be about 30 times with a 4-times margin due to the detailed models.

An average ISPeng (engine system specific thrust) is 354.7 seconds and 350 seconds will be secured for 3σ 150 sec (a value downwardly shifted by 3σ with σ being a deviation of a probability distribution of the object). If GG gas temperature (the temperature of a high-temperature gas generated by a gas generator) must be decreased, there will be a performance reduction of about −1 sec/10K.

Since the stability models are detailed, the main combustor and GG (gas generator) are well-balanced. Values O=22% PC and F=17% PC are considered to be appropriate. A regenerative cooling pressure loss is small and the influence thereof is not transferred to a pump. Instead, F is set to be 22% PC so that an injector pressure loss secures a buffer. This allows the pressure of LNG supplied to the GG to be increased, and therefore, an adjusting margin can be secured under a state of F=17% Pg.

Pc is designed to be 5.2 MPa. A statistic on the virtual prototyping shows a drop to 5.17 MPa. It is considered that tolerances of respective parts do not act equally in plus and minus directions. The difference of 0.03 MPa is a quantity to be restored by an orifice. A deviation σ=0.0379 MPa occurs, and therefore, an adjustment to 5.2 MPa will secure 5.0 MPa LOX critical pressure combustion even in the case of 3σ low.

It is considered that the thrust will vary at ±2.8 kN at 3σ around an average value of 97.3 N. This is absorbable by adjusting Pc by ±0.15 MPa. It can be absorbed with an adjusting resistance.

An index related to a pump operating state suggests that it is similar to an operation with an existing same class product. In connection with this, the size of a volute casing must be kept.

If an LNG bleed is needed for cooling a nozzle, it must be noted that ISPeng decreases by about 1 sec for each service of 0.1 kg/s.

The design result of this example based on the system of the embodiment may not be quite different from a result of conventional designing. However, it is verified that the embodiment can provide the designer with a sense of security for the design result because the embodiment embeds reliability in the design result.

The invention claimed is:

1. A product design support system comprising a computer system having an input device for data input operation, an output device for data display and printout, a data hold device having a program hold unit for holding a program library and a data storage unit for holding data, and a computer main body for getting data inputted with the input device and data held in the data hold device, invoking a necessary program from the program library held in the data hold device, and executing the invoked program, the system further includes:
a parameter set and register unit to receive a plurality of design target values necessary for designing a design object, a plurality of design parameters and a plurality of set ranges each for the respective design parameters of the design object inputted with the input device and register the design target values, the design parameters and the set ranges of design parameters into the data hold device;
a prototype simulation execution unit to invoke a simulation program for prototyping the design object from the data hold device, define respective design points for each of the design parameters within the respective set ranges of design parameters, get a large predetermined number of combinations of the design points, and execute the simulation program for prototyping plural times by using the large predetermined number of combinations of the design points in order to produce a large predetermined number of virtual prototypes that each of which can achieve the design target values, and register the large predetermined number of virtual prototypes as a group of design solutions into the data hold unit;

an evaluation index operation unit to invoke and execute an evaluation index operation program from the data hold device for the design object, compute evaluation values for evaluation for each of the large predetermined number of virtual prototypes in the group of design solutions, and register the evaluation values of the evaluation indexes with the large predetermined number of virtual prototypes in the data hold unit, respectively;

a filtering unit to receive an operation command that specifies plural kinds of evaluation index limit values, invoke and execute a filtering program from the data hold device to extract a virtual prototype group as a maximum likelihood design solution candidate group out of the design solution group in the data hold device, each virtual prototype in the virtual prototype group satisfies the specified plural kinds of evaluation index limit values, and register the maximum likelihood design solution candidate group into the data hold device;

a parameter comprehension level register unit to display on the output device a setting screen for setting user's comprehension levels about the design parameters to be used by the simulation program for prototyping, receive the user's comprehension levels set and inputted on the setting screen, and register the inputted user's comprehension levels into a risk database held in the data hold device;

a parameter influence level register unit to display on the output device a setting screen for setting influence levels of ambiguity in the design parameters to be used by the simulation program for prototyping on design solutions of the design object, receive the influence levels on design solutions of the design object set and inputted on the setting screen, and register the inputted influence levels into the risk database held in the data hold device;

a risk level operation unit to compute risk levels of design solutions of the design object with the use of the user's comprehension level and influence level of each design parameter; and a risk database management unit to make a list of names of the design parameters, the set and registered user's comprehension levels and the influence levels on design solutions of the design object, and the computed risk levels and output and display the list on the output device.

2. The product design support system using a computer system as set forth in claim 1, further comprising:

a recommended design solution find unit that receives an input for specifying design parameters for a recommended design solution, executes the simulation program and evaluation index operation program with the use of the specified design parameters to compute an evaluation index for the recommended design solution, displays the computed result on the output device, and registers the same in the data hold device.

3. The product design support system using a computer system as set forth in claim 1 or 2, wherein:

the risk database management unit makes a risk level transition list that contains the names of the design parameters, the set and registered user's comprehension levels, the influence levels on design solutions of the design object, and the computed risk levels and computation dates and outputs and displays the risk level transition list.

4. The product design support system using a computer system as set forth in claim 1, wherein:

the prototype simulation executing unit executes an orthogonal table creation program by using the design parameters registered in the data hold device to create an orthogonal table having L rows where the L corresponds to a number of the design parameters, invokes and execute the simulation program for prototyping by using a data of the orthogonal table to set a large predetermined number of combinations of the design points to obtain the large predetermined number of virtual prototypes as the design solution group, and registers the design solution group into the data hold device.

5. The product design support system using a computer system, as set forth in claim 1 or 4, further comprising:

a maximum likelihood design solution group select unit to receive a maximum likelihood design solution group select command that specifies limit index values for all of or some of the plural kinds of evaluation indexes with respect to the maximum likelihood design solution candidate group filtered by the filtering unit, select a maximum likelihood design solution group of design solutions each of which satisfies each of the specified limit index values out of the maximum likelihood design solution candidate group, and register the maximum likelihood design solution group into the data hold device.

6. The product design support system using a computer system as set forth in claim 4, further comprising:

a parameter comprehension level register unit to display on the output device a setting screen for setting user's comprehension levels about the design parameters to be used by the simulation program for prototyping, receive the user's comprehension levels set and inputted on the setting screen, and register the inputted user's comprehension levels into a risk database held in the data hold device;

a parameter influence level register unit to display on the output device a setting screen for setting influence levels of ambiguity in the design parameters to be used by the simulation program for prototyping on design solutions of the design object, receive the influence levels on design solutions of the design object set and inputted on the setting screen, and register the inputted influence levels into the risk database held in the data hold device;

a risk level operation unit to compute risk levels of design solutions of the design object with the use of the user's comprehension level and influence level of each design parameter; and a risk database management unit to make a list of names of the design parameters, the set and registered user's comprehension levels and the influence levels on design solutions of the design object, and the computed risk levels and output and display the list on the output device.

7. The product design support system using a computer system as set forth in claim 6, wherein:

the risk database management unit makes a risk level transition list that contains the names of the design parameters, the set and registered user's comprehension levels, the influence levels on design solutions of the design object, the computed risk levels and computation dates, and outputs and displays the risk level transition list.

8. A product design support method using a computer system having an input device for data input operation, an output device for data display and printout, a data hold device having a program hold unit for holding a program library and a data storage unit for holding data, and a computer main body for getting data inputted with the input device and data held in the data hold device, invoking a necessary program from the program library held in the data hold device, and executing the invoked program, the method comprising steps of:

a parameter registration step of receiving a plurality of design target values necessary for designing a design object, a plurality of design parameters and a plurality of set ranges each for the respective design parameters of the design object inputted with an input device and registering the design target values, the design parameters and the set ranges for the design parameters into a data hold device;

a prototype simulation step of invoking a simulation program for prototyping the design object from the data hold device, defining respective design points for each of the design parameters within the respective set ranges of design parameters, getting a large predetermined number of combinations of the design points, and the simulation program for prototyping plural times by using the large predetermined number of combinations of the design points in order to produce a large predetermined number of virtual prototypes that each of which can achieve the design target values, and registering the large predetermined number of virtual prototypes as a group of design solutions into the data hold device;

an evaluation index operation step invoking and executing an evaluation index operation program from the data hold device, computing evaluation values of evaluation indexes for each of the large predetermined number of virtual prototypes in the group of design solutions, and registering the evaluation values of the evaluation indexes with the large predetermined number of virtual prototypes in the data hold device, respectively;

a filtering step of receiving an operation command that specifies plural kinds of evaluation index limit values, invoking and executing a filtering program from the data hold device to extract a virtual prototype group as a maximum likelihood design solution candidate group out of the design solution group in the data hold device, each virtual prototype in the virtual prototype group satisfies the specified plural kinds of evaluation index limit values, and registering the maximum likelihood design solution candidate group into the data hold device;

a parameter comprehension level register step of displaying on the output device a setting screen for setting user's comprehension levels about the design parameters to be used by the simulation program for prototyping, receiving the user's comprehension levels set and inputted on the setting screen, and registering the same in a risk database held in the data hold device;

a parameter influence level register step of displaying on the output device a setting screen for setting influence levels of ambiguity in the design parameters to be used by the simulation program on design solutions of the design object, receiving the influence levels on design solutions of the design object set and inputted on the setting screen, and registering the same in the risk database held in the data hold device;

a risk computation step of computing risk levels of design solutions of the design object with the use of the user's comprehension level and influence level of each design parameter; and a risk management step of making a list of names of the design parameters, the set and registered user's comprehension levels and influence levels on design solutions of the design object, and the computed risk levels and outputting and displaying the list on the output device.

9. The product design support method using a computer system as set forth in claim 8, further comprising:

a recommended design solution finding step of receiving an input for specifying design parameters for a recommended design solution, executing the simulation program and evaluation index operation program with the use of the specified design parameters to compute an evaluation index for the recommended design solution, registering the computed result in the data hold device, and outputting the computed result to an output device.

10. The product design support method using a computer system as set forth in claim 8 or 9, wherein:

the risk database management step makes a risk level transition list that contains the names of the design parameters, the set and registered user's comprehension levels, the influence levels on design solutions of the design object, the computed risk levels and computation dates and outputs and displays the risk level transition list.

11. The product design support method using a computer system as set forth in claim 8, wherein:

the simulation executing step executes an orthogonal table creation program by using the design parameters and the parameter values registered in the data hold device to create an orthogonal table having L rows where the L corresponds to a number of the design parameters, invokes and executes the simulation program for prototyping by using a data of the orthogonal table to set a large predetermined number of combinations of the design points to obtain the large predetermined number of virtual prototypes as the design solution group, and registers the design solution group into the data hold device.

12. The product design support method using a computer system as set forth in claim 8 or 11, further comprising:

a maximum likelihood design solution group select step of receiving a maximum likelihood design solution group select command that specifies limit index values for all of or some of the plural kinds of evaluation indexes with respect to the maximum likelihood design solution candidate group filtered by the filtering step, selecting a maximum likelihood design solution group of design solutions each of which satisfies each of the specified limit index values out of the maximum likelihood design solution candidate group, and registering the maximum likelihood design solution group into the data hold device.

13. The product design support method using a computer system as set forth in claim 11, further comprising:

a parameter comprehension level register step of displaying on the output device a setting screen for setting user's comprehension levels about the design parameters to be used by the simulation program for prototyping, receiving the user's comprehension levels set and inputted on the setting screen, and registering the same in a risk database held in the data hold device;

a parameter influence level register step of displaying on the output device a setting screen for setting influence levels of ambiguity in the design parameters to be used by the simulation program on design solutions of the design object, receiving the influence levels on design solutions of the design object set and inputted on the setting screen, and registering the same in the risk database held in the data hold device;

a risk computation step of computing risk levels of design solutions of the design object with the use of the user's comprehension level and influence level of each design parameter; and a risk management step of making a list of names of the design parameters, the set and registered user's comprehension levels and influence levels on design solutions of the design object, and the computed risk levels and outputting and displaying the list on the output device.

* * * * *